(12) United States Patent
Nam et al.

(10) Patent No.: US 9,183,939 B2
(45) Date of Patent: Nov. 10, 2015

(54) NONVOLATILE MEMORY DEVICE, A MEMORY SYSTEM HAVING THE SAME, AND A READ METHOD THEREOF, THE READ METHOD APPLYING A READ PASS VOLTAGE TO A SELECTED WORDLINE AFTER A SENSING

(71) Applicant: SAMSUNG ELECTRONICS CO., LTD., Suwon-si, Gyeonggi-do (KR)

(72) Inventors: Sang-Wan Nam, Hwaseong-si (KR); Kitae Park, Seongnam-si (KR); Hyun-Wook Park, Hwaseong-si (KR); Jae-Kyun Rhee, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/242,332

(22) Filed: Apr. 1, 2014

(65) Prior Publication Data

US 2015/0003169 A1    Jan. 1, 2015

(30) Foreign Application Priority Data

Jun. 27, 2013 (KR) .................. 10-2013-0074576

(51) Int. Cl.
| G11C 16/06 | (2006.01) |
| --- | --- |
| G11C 16/26 | (2006.01) |
| G11C 11/56 | (2006.01) |
| G11C 16/04 | (2006.01) |
| G11C 16/34 | (2006.01) |

(52) U.S. Cl.
CPC ............ *G11C 16/26* (2013.01); *G11C 11/5628* (2013.01); *G11C 16/0483* (2013.01); *G11C 16/3427* (2013.01)

(58) Field of Classification Search
CPC ......... G11C 16/24; G11C 16/10; G11C 16/26
USPC .............. 365/189.25, 185.18, 189.09, 185.21
See application file for complete search history.

(56) References Cited

U.S. PATENT DOCUMENTS

| 7,349,258 | B2 | 3/2008 | Fong et al. | |
| --- | --- | --- | --- | --- |
| 7,495,956 | B2 | 2/2009 | Fong et al. | |
| 7,852,676 | B2 | 12/2010 | Maejima | |
| 7,898,872 | B2 * | 3/2011 | Han | 365/185.25 |
| 2005/0162913 | A1 | 7/2005 | Chen | |
| 2005/0226048 | A1 | 10/2005 | Lee | |
| 2007/0121376 | A1 * | 5/2007 | Toda | 365/185.2 |
| 2007/0133295 | A1 * | 6/2007 | Fong et al. | 365/185.21 |
| 2008/0094914 | A1 | 4/2008 | Park et al. | |
| 2008/0144378 | A1 * | 6/2008 | Park et al. | 365/185.05 |
| 2008/0266973 | A1 | 10/2008 | Sekar et al. | |

(Continued)

FOREIGN PATENT DOCUMENTS

| KR | 1020050097595 | 10/2005 |
| --- | --- | --- |
| KR | 20070007283 | 1/2007 |

(Continued)

*Primary Examiner* — Connie Yoha
(74) *Attorney, Agent, or Firm* — F. Chau & Associates, LLC

(57) ABSTRACT

A method of reading a nonvolatile memory device including: applying a read voltage to a selected wordline of the nonvolatile memory device; applying a read pass voltage to unselected wordlines of the nonvolatile memory device; sensing a state of a memory cell connected to the selected wordline; and applying the read pass voltage to the selected wordline after the sensing.

25 Claims, 26 Drawing Sheets

(56) References Cited

U.S. PATENT DOCUMENTS

| | | |
|---|---|---|
| 2008/0298127 A1 | 12/2008 | Kim et al. |
| 2009/0138652 A1 | 5/2009 | Kim et al. |
| 2009/0168533 A1 | 7/2009 | Park et al. |
| 2010/0008389 A1* | 1/2010 | Jackson et al. .......... 372/34 |
| 2010/0034022 A1 | 2/2010 | Dutta et al. |
| 2010/0157671 A1 | 6/2010 | Mokhlesi |
| 2010/0271874 A1 | 10/2010 | Mokhlesi et al. |
| 2011/0317489 A1 | 12/2011 | Kim et al. |
| 2013/0051152 A1* | 2/2013 | Lee et al. .......... 365/185.18 |

FOREIGN PATENT DOCUMENTS

| | | |
|---|---|---|
| KR | 100790823 | 12/2007 |
| KR | 1020080035828 | 4/2008 |
| KR | 1020080105753 | 12/2008 |
| KR | 1020090055314 | 6/2009 |
| KR | 1020090072406 | 7/2009 |
| KR | 20100024918 | 3/2010 |
| KR | 20110038083 | 4/2011 |
| KR | 20110056285 | 5/2011 |
| KR | 20110106378 | 9/2011 |
| KR | 1020120000900 | 1/2012 |

* cited by examiner

NONVOLATILE MEMORY DEVICE, A MEMORY SYSTEM HAVING THE SAME, AND A READ METHOD THEREOF, THE READ METHOD APPLYING A READ PASS VOLTAGE TO A SELECTED WORDLINE AFTER A SENSING

CROSS-REFERENCE TO RELATED APPLICATION

This application claims priority under 35 U.S.C. §119 to Korean Patent Application No. 10-2013-0074576 filed Jun. 27, 2013, in the Korean Intellectual Property Office, the disclosure of which is incorporated by reference herein in its entirety.

BACKGROUND

1. Technical Field

The inventive concept relates to a nonvolatile memory device, a memory system including the nonvolatile memory device, and a read method of the memory system.

2. Discussion of the Related Art

Semiconductor memory devices may be volatile or nonvolatile. A nonvolatile semiconductor memory device can retain data stored therein even when not powered. The nonvolatile memory device may be permanent or reprogrammable. The nonvolatile memory device may be used for user data, program, and microcode storage in a wide variety of applications in the computer, avionics, telecommunications, and consumer electronics industries.

SUMMARY

An exemplary embodiment of the inventive concept provides, a method of reading a nonvolatile memory device comprising: applying a read voltage to a selected wordline of the nonvolatile memory device; applying a read pass voltage to unselected wordlines of the nonvolatile memory device; sensing a state of a memory cell connected to the selected wordline; and applying the read pass voltage to the selected wordline after the sensing.

The method further comprises discharging the read pass voltages of the selected wordline and the unselected wordlines.

The read voltage includes a first voltage and a second voltage, and the second voltage has a level between the first voltage and the read pass voltage.

A voltage of the unselected wordlines disposed between the selected wordline and a string selection line of the nonvolatile memory device begins to be discharged while the read pass voltage is applied to the selected wordline.

A voltage of the unselected wordlines disposed between the selected wordline and a ground selection line of the nonvolatile memory device begins to be discharged after the read pass voltage is applied to the selected wordline.

The unselected wordlines disposed between the selected wordline and a string selection line of the nonvolatile memory device include a first wordline group and a second wordline group, and a voltage of the first wordline group and a voltage of the second wordline group are sequentially discharged.

The voltage of the first wordline group and the voltage of the second wordline group are different from each other.

The method further comprises discharging voltages of a selected string selection line or a selected ground selection line of the nonvolatile memory device.

The method further comprises: applying the read pass voltage to an unselected string selection line of the nonvolatile memory device after the sensing; and discharging the read pass voltage of the unselected string selection line.

The method further comprises: applying the read pass voltage to an unselected string selection line of the nonvolatile memory device before the sensing; and discharging the read pass voltage of the unselected string selection line.

The method further comprises: applying the read pass voltage to the selected wordline before the sensing; and discharging the read pass voltage of the selected wordline before the sensing.

An exemplary embodiment of the inventive concept provides a method of reading a nonvolatile memory device comprising: applying a read voltage to a selected wordline of the nonvolatile memory device; applying a read pass voltage to unselected wordlines of the nonvolatile memory device; sensing a state of a memory cell connected to the selected wordline; and applying a turn-on voltage to the selected wordline after the sensing.

A plurality of different read pass voltages are applied the unselected word lines.

The method further comprises discharging the voltages of the unselected wordlines and the selected wordline.

The voltages of the unselected wordlines are sequentially discharged.

An exemplary embodiment of the inventive concept provides a method of reading a nonvolatile memory device comprising: applying a read voltage to a selected wordline of the nonvolatile memory device; applying a read pass voltage to unselected wordlines of the nonvolatile memory device; sensing a state of a memory cell connected to the selected wordline; and applying a turn-on voltage to the selected wordline after the sensing and while the read pass voltage is applied to the unselected wordlines, wherein a voltage of the unselected wordlines disposed between the selected wordline and a string selection line of the nonvolatile memory device begins to be discharged while the turn-on voltage is applied to the selected wordline.

The turn-on voltage is applied to the selected wordline according to health information of the nonvolatile memory device.

The health information includes a level of deterioration of memory cells, program/erase cycling information, wear-leveling information, or a number of errors detected by error checking and correction.

The turn-on voltage is applied to the selected wordline when a program/erase cycle value of a read requested memory block is larger than a predetermined value.

The unselected wordlines are arranged in a plurality of zones and voltages of the zones are sequentially discharged from a zone near the string selection line to a zone near a ground selection line of the nonvolatile memory device.

An exemplary embodiment of the inventive concept provides a memory system comprising: a memory controller configured to output immune disturbance read mode information; and a nonvolatile memory device configured to program memory cells connected to a selected wordline, perform a verification read operation on the memory cells connected to the selected wordline and, in response to the immune disturbance read mode information, apply a turn-on voltage to the selected wordline while a read pass voltage is applied to unselected wordlines.

The memory controller generates the immune disturbance read mode information when a program/erase cycle value of a read requested memory block is larger than a predetermined value.

The wordlines are stacked on top of each other between a substrate and a bit line.

The nonvolatile memory device is a vertical NAND flash memory.

The nonvolatile memory device includes first and second adjacent strings connected with a first bit line, wherein the first and second strings each include string selection lines, wordlines, and dummy wordlines.

The first and second strings are disposed on a silicon on insulator substrate.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
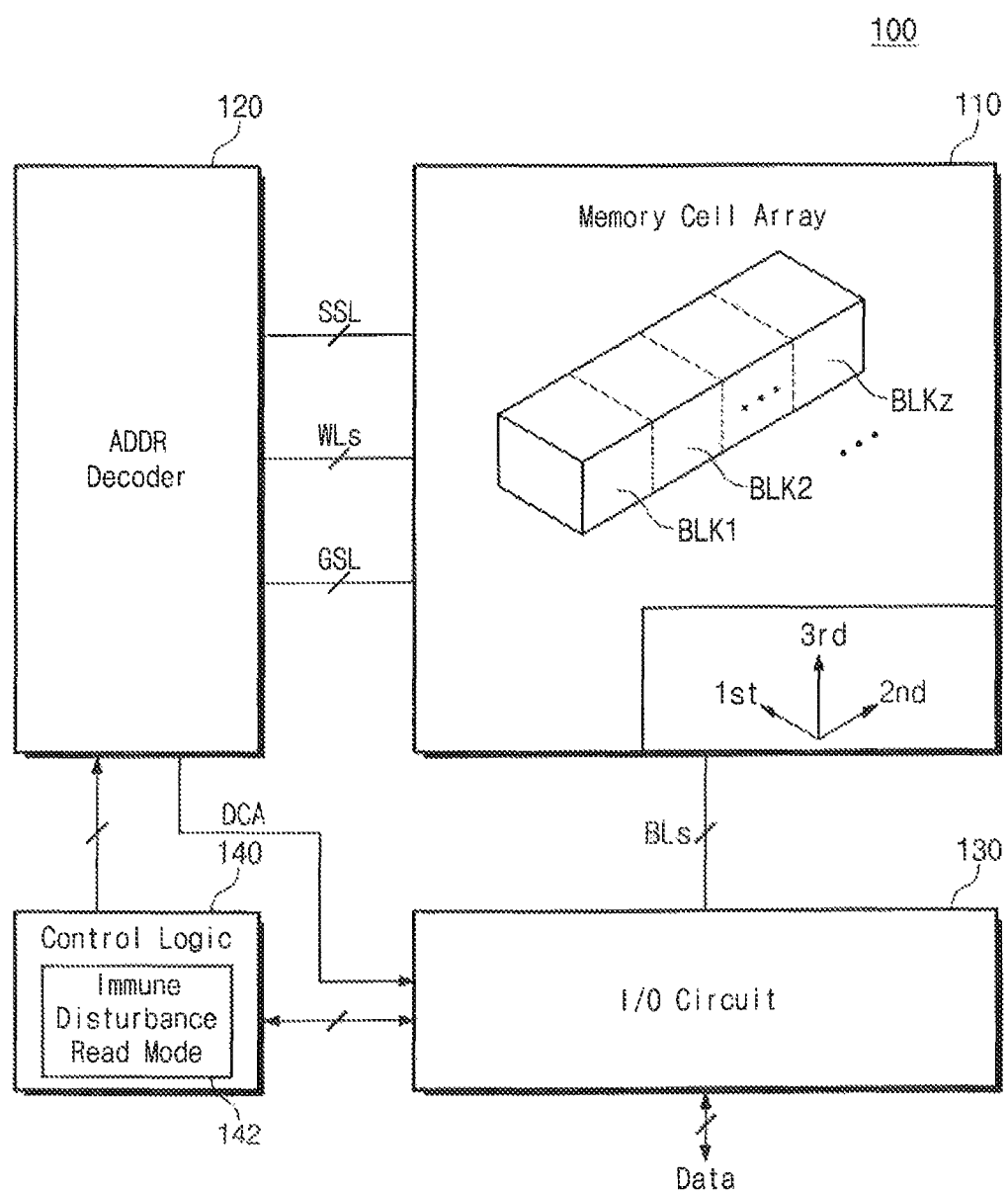
FIG. 1 is a block diagram illustrating a nonvolatile memory device according to an exemplary embodiment of the inventive concept.

Hereinafter, exemplary embodiments of the inventive concept will be described in detail with reference to the accompanying drawings. The inventive concept, however, may be embodied in various different forms, and should not be construed as being limited only to the illustrated embodiments. Like reference numerals may denote like elements throughout the attached drawings and written description. In the drawings, the sizes and relative sizes of layers and regions may be exaggerated for clarity.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

A nonvolatile memory device according to an exemplary embodiment of the inventive concept may reduce a read disturbance by controlling/discharging/diffusing/sharing channel charges of strings before and/or after a sensing operation.

FIG. 1 is a block diagram illustrating a nonvolatile memory device 100 according to an exemplary embodiment of the inventive concept. Referring to FIG. 1, the nonvolatile memory device 100 may include a memory cell array 110, an address decoder 120, an input/output circuit 130, and control logic 140.

The memory cell array 110 may be connected to the address decoder 120 through word lines WLs, at least one string selection line SSL, and at least one ground selection line GSL. The memory cell array 110 may be connected to the input/output circuit 130 through bit lines BLs. The memory cell array 110 may include a plurality of memory blocks BLK1 to BLKz.

Each of the memory blocks BLK1 to BLKz may include a plurality of strings which are arranged along a first direction and a second direction different from the first direction and along a third direction (e.g., a direction perpendicular to a plane formed in the first and second directions) to have a three-dimensional structure. Here, each string may include at least one string selection transistor, a plurality of memory cells, and at least one ground selection transistor stacked on a substrate. Each memory cell may store at least one data bit.

The address decoder 120 may be connected to the memory cell array 110 through the word lines WLs, the string selection line SSL and the ground selection line GSL. The address decoder 120 may select the word lines WLs, the string selection line SSL and the ground selection line GSL using a decoded row address. The address decoder 120 may decode a column address of an input address ADDR. The decoded column address DCA may be provided to the input/output circuit 130. In exemplary embodiments of the inventive concept, the address decoder 120 may include a row decoder, a column decoder, an address buffer, and so on.

The input/output circuit 130 may be connected to the memory cell array 110 through the bit lines BLs. The input/output circuit 130 may be configured to receive the decoded column address DCA from the address decoder 120. The input/output circuit 130 may select the bit lines BLs using the decoded column address DCA.

The input/output circuit 130 may receive data from an external device (e.g., a memory controller) to store it at the memory cell array 110. The input/output circuit 130 may read data from the memory cell array 110 to output it to the external device. In addition, the input/output circuit 130 may read data from a first area of the memory cell array 110 to store it at a second area of the memory cell array 110. For example, the input/output circuit 130 may be configured to perform a copy-back operation.

The control logic 140 may control an overall operation of the nonvolatile memory device 100 including a program operation, a read operation, an erase operation, and so on. The control logic 140 may operate in response to control signals or a command provided from the external device. The control logic 140 may provide an immune disturbance read mode 142 for controlling channel charges of a string to reduce a read disturbance.

The immune disturbance read mode 142 may be divided into a first immune disturbance read mode for controlling channel charges before a sensing operation and a second immune disturbance read mode for controlling channel charges after the sensing operation. Here, a channel charge control method may include discharging channels charges or sharing the channel charges.

For example, the control logic 140 may control the address decoder 120 to spread boosting charges of a channel (in other words, a channel sharing boosting charges) of each string to reduce a read disturbance at a recovery operation following the sensing operation.

In exemplary embodiments of the inventive concept, the immune disturbance read mode 142 may be selectively performed by a mode of operation (e.g., programming, reading, erasing, etc.). For example, at a read mode of operation, the immune disturbance read mode 142 may be executed. For example, the immune disturbance read mode 142 may not be executed at program and erase modes of operation.

In exemplary embodiments of the inventive concept, the immune disturbance read mode 142 may be executed by a separate request provided from an external device.

As will be described hereafter, a read disturbance of the nonvolatile memory device 100 according to an exemplary embodiment of the inventive concept may be reduced by performing the immune disturbance read mode 142.

Figure 2A:
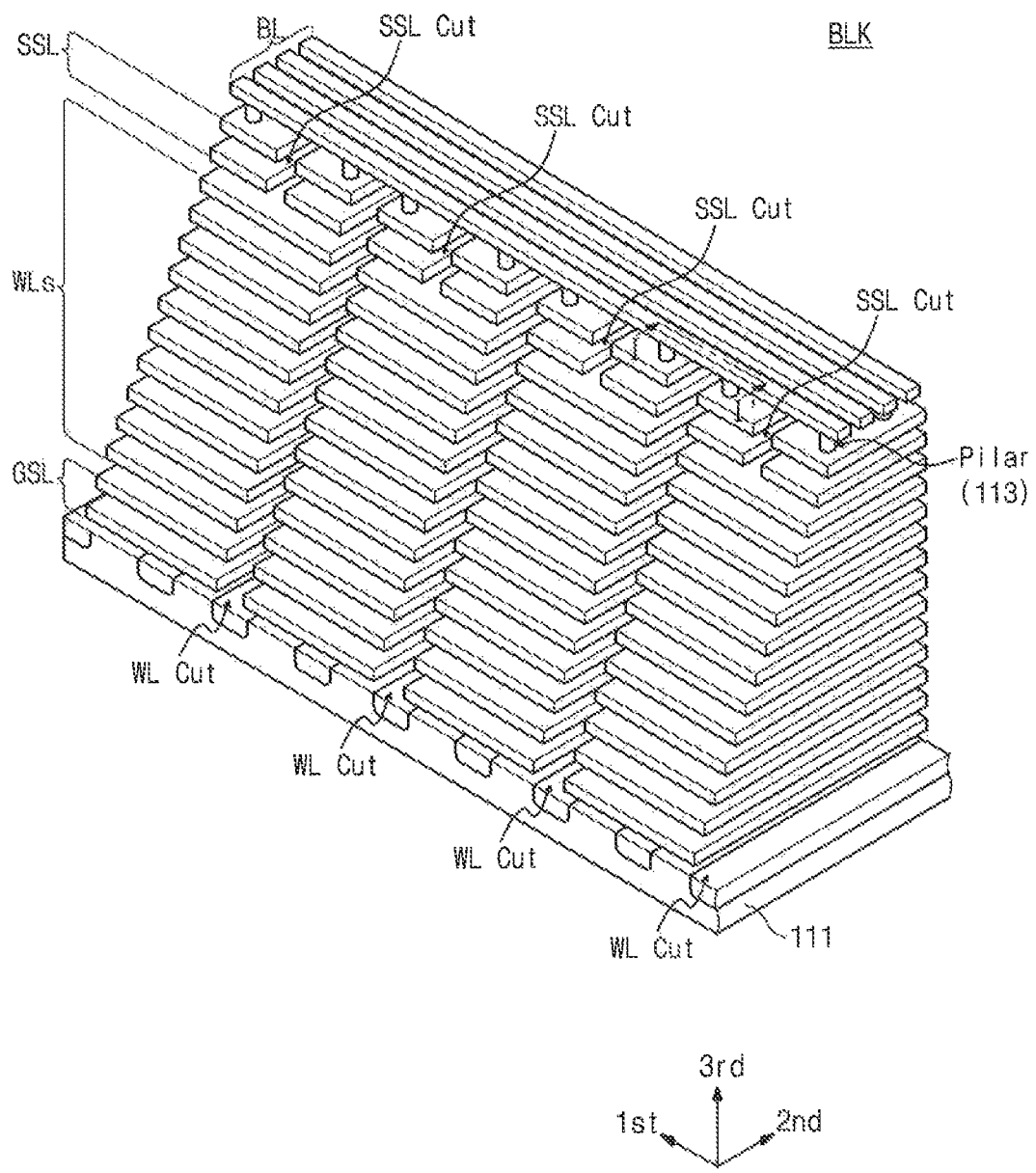
FIG. 2A is a perspective view of a memory block BLK of FIG. 1, according to an exemplary embodiment of the inventive concept.

FIG. 2A is a perspective view of a memory block BLK of FIG. 1, according to an exemplary embodiment of the inventive concept.

Referring to FIG. 2A, four sub blocks may be formed on a substrate 111. Each sub block may be formed by stacking at least one ground selection line GSL, a plurality of word lines WLs, and at least one string selection line SSL in a plate shape on the substrate 111 between word line cuts WL Cuts. The string selection line SSL may be separated by string selection line cuts SSL Cuts. Each word line cut WL Cut may include a common source line CSL. In exemplary embodiments of the inventive concept, the common source lines CSL included in the word line cuts WL Cuts may be interconnected. A string may be formed by making a pillar 113 connected with a bit line BL penetrating the at least one string selection line SSL, the word lines WLs, and the at least one ground selection line GSL.

In FIG. 2A, a structure between word line cuts WL Cuts may be a sub block. However, the inventive concept is not limited thereto. For example, a structure between a word line cut WL Cut and a string selection line cut SSL Cut may be a sub block.

The memory block BLK according to an exemplary embodiment of the inventive concept may be implemented to have a merged word line structure where two word lines are merged to one.

Figure 2B:
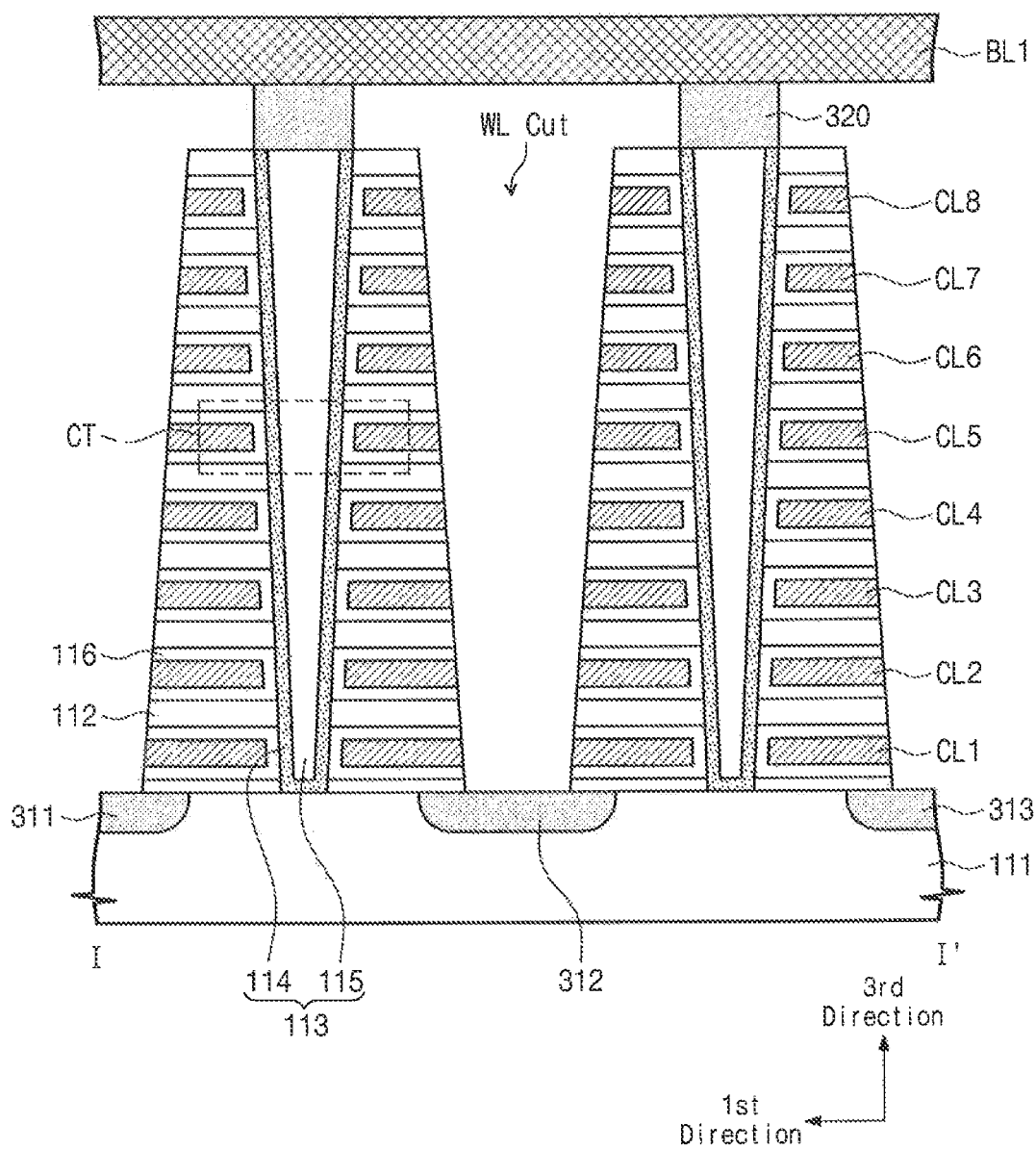
FIG. 2B is a cross-sectional view taken along line I-I' of FIG. 2A, according to an exemplary embodiment of the inventive concept.

FIG. 2B is a cross-sectional view taken along line I-I' of FIG. 2A, according to an exemplary embodiment of the inventive concept.

Referring to FIG. 2B, a substrate 111 may be a well having a first conductive type. The substrate 111 may be formed of a p-well in which a Group-III element (e.g., boron) is injected, for example. Alternatively, the substrate 111 may be a pocket p-well provided within an n-well. Below, it is assumed that the substrate 111 is a p-well (or, a pocket p-well). However, the substrate 111 is not limited to a p-well.

A plurality of doping regions 311 to 313 may have a second conductive type different from that of the substrate 111. For example, the doping regions 311 to 313 may be n-type. Below, it is assumed that first to third doping regions 311 to 313 are n-type. However, the first to third doping regions 311 to 313 are not limited to the n-type.

On the substrate 111 between adjacent doping regions of the first to third doping regions 311 to 313, a plurality of insulation materials 112 may be provided sequentially along a third direction (e.g., a direction perpendicular to the substrate 111). The insulation materials 112 may be formed to be spaced apart along the third direction. For example, the insulation materials 112 may include an insulation material such as oxide. In exemplary embodiments of the inventive concept, a thickness of an insulation material 112, contacting with the substrate 111, from among the insulation materials 112 may be thinner than that of the remaining insulation materials 112.

On the substrate 111 between adjacent doping regions of the first to third doping regions 311 to 313, a plurality of pillars 113 may be sequentially arranged along a first direction to penetrate the plurality of insulation materials 112 along a second direction. For example, the pillars 113 may contact with the substrate 111 through the insulation materials 112.

In exemplary embodiments of the inventive concept, each pillar 113 may be formed of a plurality of materials. For example, a surface layer 114 of each pillar 113 may include a first type of silicon material (e.g., silicon). For example, the surface layer 114 of each pillar 113 may include a semiconductor material (e.g., silicon) having the same type as that of the substrate 111. Below, it is assumed that the surface layer 114 of each pillar 113 includes p-type silicon. However, the surface layer 114 of each pillar 113 is not limited to the p-type silicon. For example, the surface layer 114 of each pillar 113 may include an intrinsic semiconductor.

An inner layer 115 of each pillar 113 may include an insulation material. For example, the inner layer 115 of each pillar 113 may include an insulation material such as silicon oxide. For example, the inner layer 115 of each pillar 113 may include air gap.

Insulation films 116 may be provided on exposed surfaces of the insulation materials 112 and the pillars 113 between adjacent doping regions of the first to third doping regions 311 to 313.

In exemplary embodiments of the inventive concept, a thickness of the insulation film 116 may be less than half the distance between insulation materials 112. In other words, a material different from the insulation materials 112 and the insulation film 116 may be provided between the insulation film 116 provided on a lower surface of an insulation material 112 placed above the insulation film 116, and between the insulation film 116 provided on an upper surface of an insulation material 112 placed below the insulation film 116.

Conductive materials CL1 to CL8 may be provided on exposed surfaces of the insulation films 116 between adjacent doping regions of the first to third doping regions 311 to 313. For example, the conductive materials CL1 to CL8 extending along the first direction may be provided between the insulation film 116 provided on a lower surface of an insulation material 112 placed above the insulation film 116, and between the insulation film 116 provided on an upper surface of an insulation material 112 placed below the insulation film 116. The conductive materials CL1 to CL8 may be separated on the doping regions 311 to 313 by word line cuts WL Cuts. In exemplary embodiments of the inventive concept, the conductive materials CL1 to CL8 may include a metallic conductive material. The conductive materials CL1 to CL8 can include a non-metallic conductive material such as polysilicon.

In exemplary embodiments of the inventive concept, the insulation film 116, which is provided on an exposed surface of the last insulation material 112, can be removed. In exemplary embodiments of the inventive concept, the insulation film 116 can be removed from the sides of the insulation materials 112 which are opposite to the pillar 113.

Drains 320 may be provided on the pillars 113, respectively. The drains 320 may be second-type silicon materials (e.g., silicon). The drains 320 may be n-type semiconductor materials (e.g., silicon). Below, it is assumed that the drains 320 include n-type silicon materials. However, the drains 320 are not limited to include n-type silicon materials. In exemplary embodiments of the inventive concept, the drain 320 may extend toward a top of the surface layer 114 of the pillar 113.

A bit line BL1 may be connected with the drains 320. In exemplary embodiments of the inventive concept, the drains 320 and the bit line BL1 may be electrically connected through contact plugs. In exemplary embodiments of the inventive concept, the bit line BL1 may be a metallic conductive material. In exemplary embodiments of the inventive concept, the bit line BL1 may include a non-metallic conductive material such as polysilicon.

The pillars 113 may form a plurality of cell strings CS with the insulation films 116 and the conductive materials CL1 to CL8. The pillar 113 may form a cell string CS with the insulation film 116 and the conductive lines CL1 to CL8 adjacent thereto.

The pillars 113 may be arranged on the substrate 111 along row and column directions. In other words, the memory block BLK may include a plurality of cell strings CS arranged on the substrate 111 along the row and column directions. Each cell string CS may include a plurality of cell transistor structures CT stacked in a direction perpendicular to the substrate 111.

Figure 3:
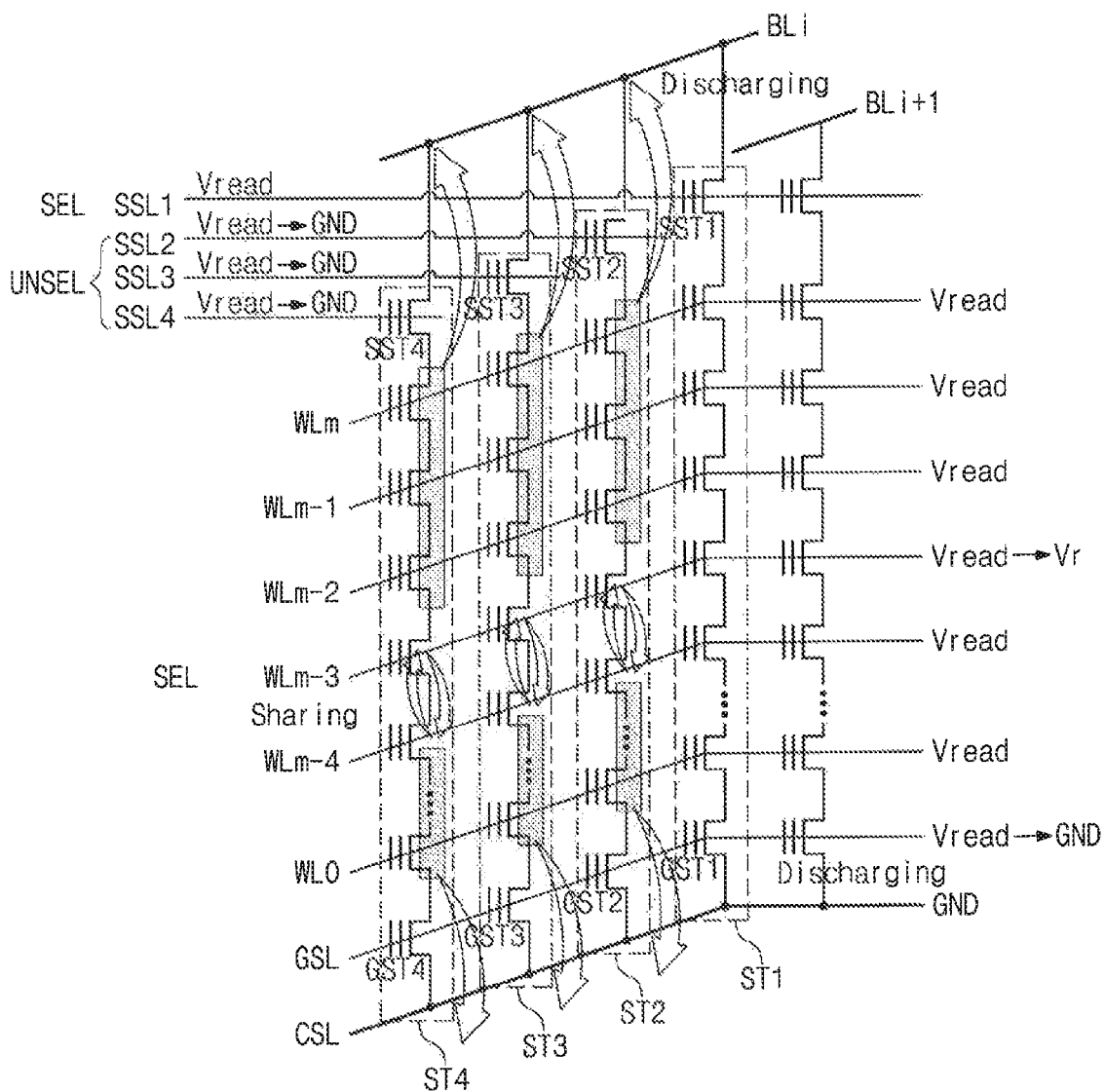
FIG. 3 is a diagram illustrating a conventional channel charge control method of a nonvolatile memory device.

FIG. 3 is a diagram illustrating a conventional channel charge control method of a nonvolatile memory device. In FIG. 3, there is illustrated a read operation on memory cells corresponding to a word line WLm−3 and a string selection line SSL1. For ease of description, it is assumed that a bit line BLi is connected with four strings ST1 to ST4. Here, the string ST1 may be a selected string, and the remaining strings ST2 to ST4 may be unselected strings.

Referring to FIG. 3, a method of controlling channel charges before a sensing operation may be divided into sharing of boosting charges (corresponding to gray portions) of the unselected strings ST2 to ST4 and discharging of the boosting charges. To share boosting charges of the unselected strings ST2 to ST4 before a sensing operation, a read pass voltage Vread may be applied to the selected word line WLm−3. Here, a voltage applied to the selected word line WLm−3 to share boosting charges may not be limited to the read pass voltage Vread. A voltage applied to the selected word line WLm−3 to share boosting charges may include voltages sufficient to turn on memory cells connected with the selected word line WLm−3. Then, the read pass voltage Vread may be applied to unselected string selection lines SSL2, SSL3 and SSL4 to discharge boosting charges (corresponding to gray portions) to the bit line BLi and/or a common source line CSL of the unselected strings ST2 to ST4 before the sensing operation.

As described above, after boosting charges of the unselected strings ST2 to ST4 are discharged or shared, bit lines BLi and BLi+1 may be pre-charged, a ground voltage GND may be applied to the unselected string selection lines SSL2, SSL3 and SSL4, a read voltage Vr may be applied to the selected word line WLm−3, and the read pass voltage Vread may be applied to the remaining word lines WL0 to WLm−4 and WLm−2 to WLm. Under this bias condition, a sensing operation may be performed to detect on or off states of memory cells corresponding to the selected word line WLm−3 and the selected string selection line SSL1.

The nonvolatile memory device 100 according to an exemplary embodiment of the inventive concept may reduce a read disturbance by removing (e.g., sharing/discharging) boosting charges of unselected strings (e.g., ST2 to ST4) before a sensing operation.

Figure 4:
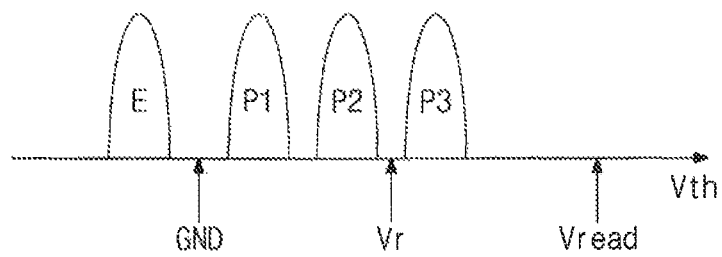
FIG. 4 is a diagram illustrating the relationship between voltages used at a read operation according to an exemplary embodiment of the inventive concept.

FIG. 4 is a diagram illustrating the relationship between voltages used at a read operation according to an exemplary embodiment of the inventive concept. For ease of description, it is assumed that a memory cell is programmed to have one of four states E, P1, P2, and P3. Referring to FIG. 4, a ground voltage GND may be used to distinguish an erase state E and a first program state P1. A read voltage Vr may be used to determine the uppermost state P3. A read pass voltage Vread may have a level sufficient to turn on programmed memory cells. For example, the read pass voltage Vread may be about 7V.

Figure 5:
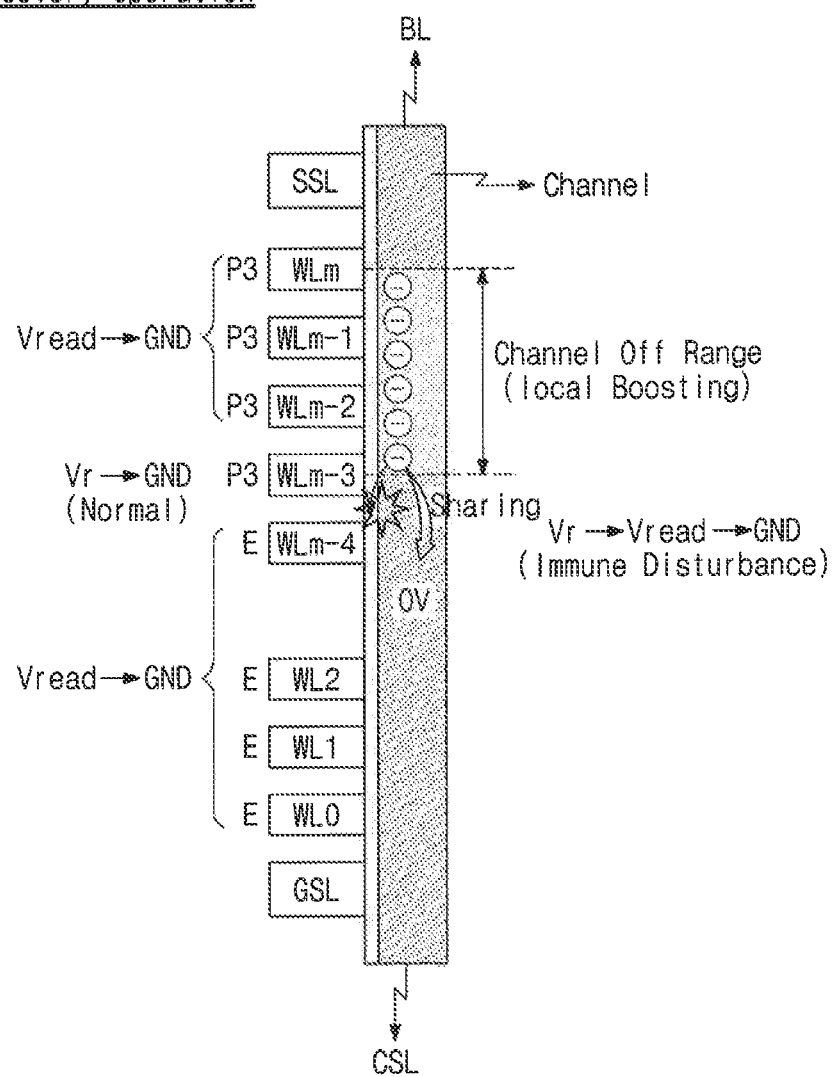
FIG. 5 is a diagram for describing a read disturbance generated at a recovery operation following a sensing operation and a channel charge control method of reducing the read disturbance according to an exemplary embodiment of the inventive concept.

FIG. 5 is a diagram for describing a read disturbance generated at a recovery operation following a sensing operation and a channel charge control method of reducing the read disturbance according to an exemplary embodiment of the inventive concept. In FIG. 5, it is assumed that memory cells connected with a selected word line WLm−3 and upper word lines WLm, WLm−1, and WLm−2 of the selected word line WLm−3 have the uppermost program state P3. With this assumption, there may be formed a channel off range (e.g., a local boosting range) corresponding to memory cells connected with the selected word line WLm−3 and the upper word lines WLm, WLm−1, and WLm−2.

In the event that a recovery operation following a sensing operation is performed, voltages of the upper word lines WLm, WLm−1, and WLm−2 may be changed from a ground voltage GND to a read pass voltage Vread. In this case, charges in the channel off range may experience negative down coupling. This may be referred to as negative boosting. As a result, negative charges may increase at the channel off range. However, since a channel corresponding to the memory cells of the upper word lines WLm, WLm−1, and WLm−2 is at an off state, negative charges increased may not be discharged. At this time, a voltage of the channel off range may be a negative voltage due to the negative boosting, and a voltage of a channel corresponding to memory cells connected with lower word lines WLm−4 to WL0 of the selected word line WLm−3 may be a ground voltage GND (e.g., 0V) because the channel corresponding to memory cells connected with the lower word lines WLm−4 to WL0 is connected with a common source line CSL.

As a voltage difference between the negative voltage of the channel off range and the ground voltage (e.g., 0V) increases, an erased memory cell connected with the word line WLm−4 may be programmed by Band To Band Tunneling (BTBT) or Hot Carrier Injection (HCI). In other words, a read disturbance may be generated. As the read voltage Vr becomes higher and the number of read operations increases, such a read disturbance may be intensified.

In an exemplary embodiment of the inventive concept, boosting charges of the channel off range may be shared by the rest of the channel by turning on a memory cell connected with the selected word line WLm−3 during a predetermined time to reduce a read disturbance due to the negative boosting at a recovery operation. In exemplary embodiments of the inventive concept, a read pass voltage Vread may be applied to the selected word line WLm−3 during a predetermined time to turn on a memory cell connected with the selected word line WLm−3 during the predetermined time after a sensing operation. In addition, a voltage for turning on a memory cell connected with the selected word line WLm−3 may not be limited to the read pass voltage Vread.

A nonvolatile memory device 100 according to an exemplary embodiment of the inventive concept may be implemented to share boosting charges at a string channel to reduce a read disturbance after a sensing operation.

Figure 6:
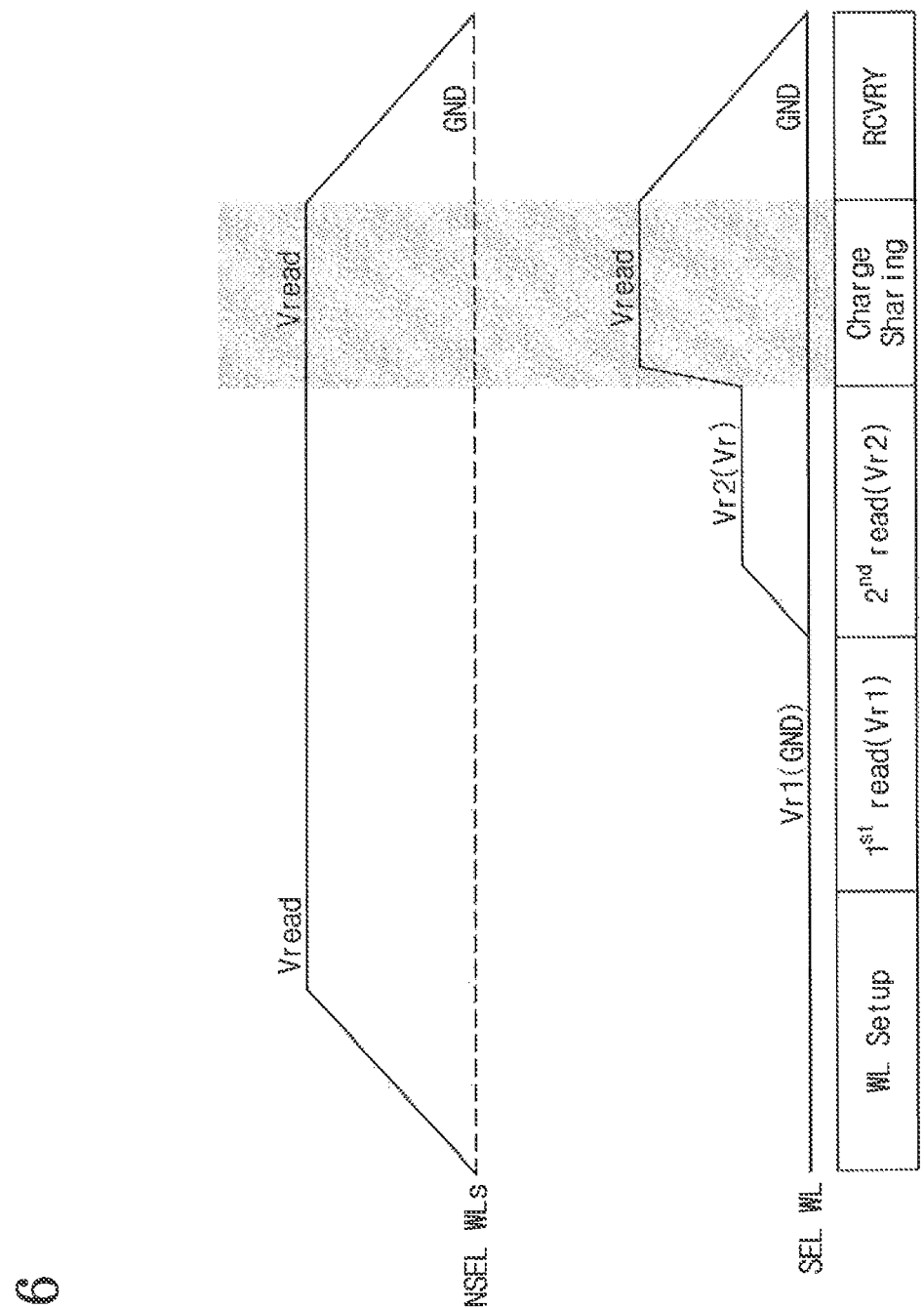
FIG. 6 is a timing diagram illustrating an immune disturbance read operation according to an exemplary embodiment of the inventive concept.

FIG. 6 is a timing diagram illustrating an immune disturbance read operation according to an exemplary embodiment of the inventive concept. Referring to FIGS. 1 to 6, an immune disturbance read operation may include a word line setup section WL Setup, a first read section 1$^{st}$ read, a second read section 2$^{nd}$ read, a charge sharing section Charge Sharing, and a recovery section RCVRY. Here, it is assumed that a read operation is a 2-bit multi level cell (MLC) read operation. As illustrated in FIG. 3, data stored at a memory cell may be determined through read operations using two voltages GND and Vr.

In the word line setup section WL Setup, a ground voltage GND may be applied to a selected word line SEL WL, and a read pass Vread voltage may be applied to unselected word lines UNSEL WLs.

In the first read section read, a first sensing operation may be performed to sense an on/off state of a memory cell using the ground voltage GND (or, a first read voltage Vr1). Afterwards, in the second read section 2$^{nd}$ read, a second sensing operation may be performed to sense an on/off state of the memory cell using the read voltage Vr (or, a second read voltage Vr2). A data value stored at the memory cell may be read out according to results of the first and second sensing operations.

In the charge sharing section Charge Sharing, the read pass voltage Vread may be applied to the selected word line SEL WL. In this case, as illustrated in FIG. 5, boosting charges of a channel off range may be shared by the rest of the channel.

In the recovery section RCVRY, voltages of the selected and unselected word lines SEL WL and UNSEL WLs may be discharged to the ground voltage GND.

An immune disturbance read operation according to an exemplary embodiment of the inventive concept may be performed such that boosting charges are shared before a recovery operation.

In FIG. 6, there is illustrated an exemplary embodiment of the inventive concept where the recovery operation is performed after charge sharing. However, the inventive concept is not limited thereto. For example, in the case of word lines expected to correspond to a channel off range, the recovery operation may be performed prior to the charge sharing to reduce negative boosting. Here, an expected channel off range may be a channel corresponding to word lines between the selected word line WLm−3 (refer to FIG. 5) and a string selection line SSL (refer to FIG. 5). For ease of description, an expected channel off range may be referred to as a channel off range.

Figure 7:
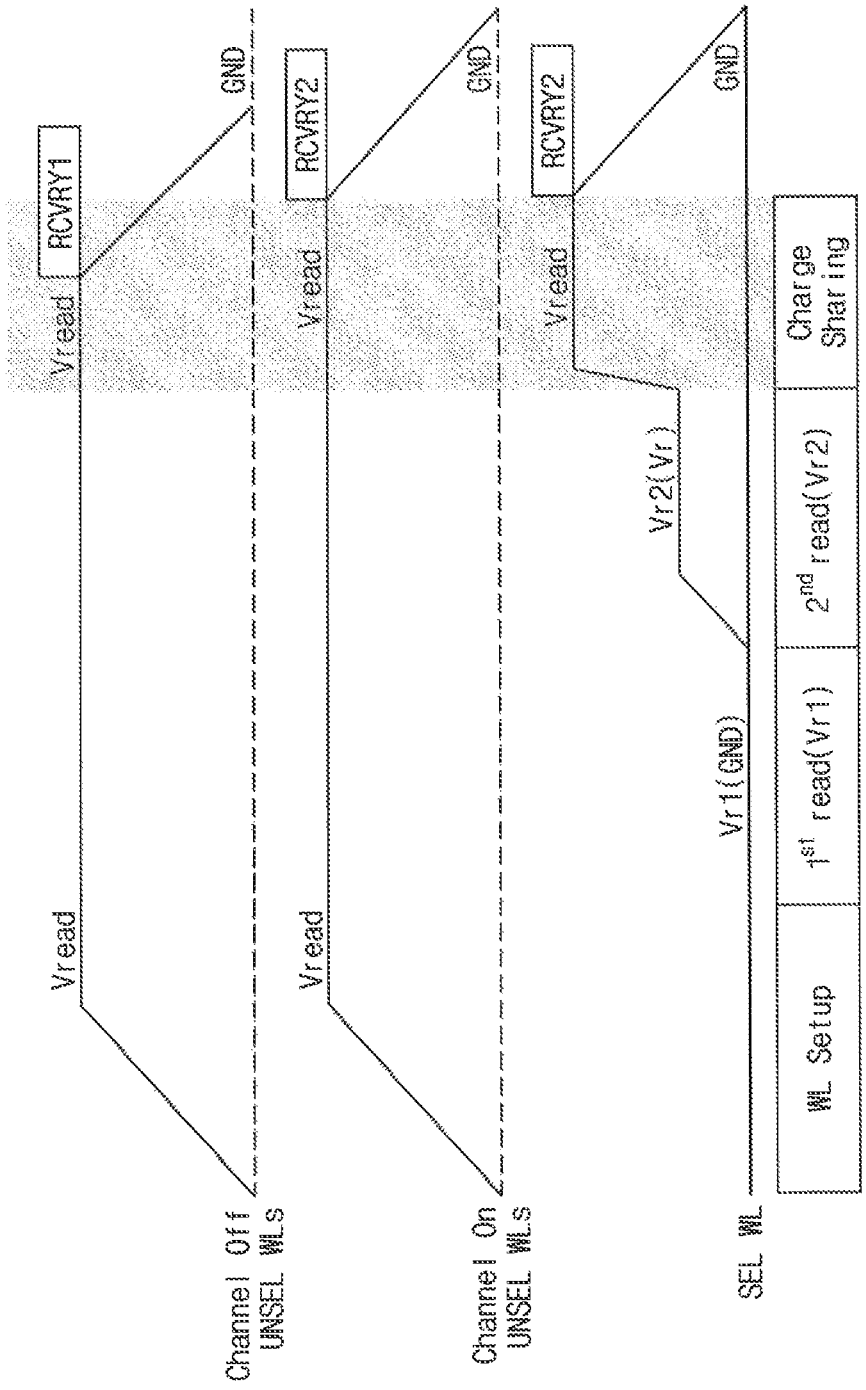
FIG. 7 is a timing diagram illustrating an immune disturbance read operation according to an exemplary embodiment of the inventive concept.

FIG. 7 is a timing diagram illustrating an immune disturbance read operation according to an exemplary embodiment of the inventive concept. Referring to FIG. 7, a first recovery operation RCVRY1 on unselected word lines (e.g., WLm, WLm−1, WLm−2 in FIG. 5) corresponding to a channel off range may be performed during a charge sharing section Charge Sharing, and a second recovery operation RCVRY2 on unselected word lines (e.g., WLm−4 to WL0 in FIG. 5) corresponding to a channel on range and the selected word line WLm−3 may be executed after the charge sharing section Charge Sharing.

With the immune disturbance read operation according to an exemplary embodiment of the inventive concept, boosting charges may be shared while a part of a recovery operation is being performed.

In FIG. 7, there is illustrated an exemplary embodiment of the inventive concept where unselected word lines corresponding to a channel off range are recovered at the same time. However, the inventive concept is not limited thereto. For example, unselected word lines corresponding to a channel off range may be grouped, and these unselected word lines may be recovered by group.

Figure 8:
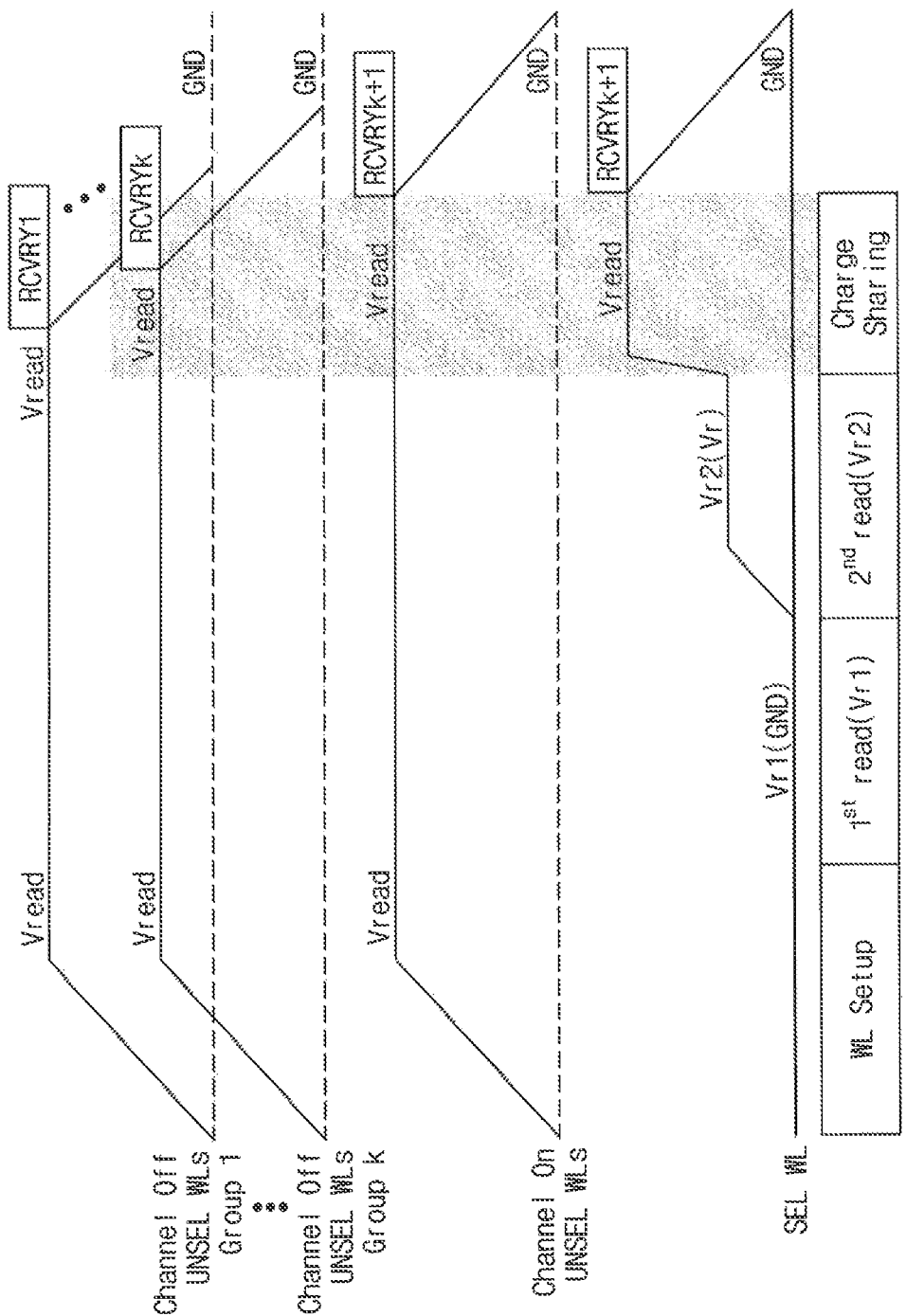
FIG. 8 is a timing diagram illustrating an immune disturbance read operation according to an exemplary embodiment of the inventive concept.

FIG. 8 is a timing diagram illustrating an immune disturbance read operation according to an exemplary embodiment of the inventive concept. Referring to FIG. 8, unselected word lines (e.g., WLm, WLm−1, WLm−2 in FIG. 5) corresponding to a channel off range may be divided into a plurality of groups Group 1 . . . Group k, and recovery operations RCVRY1 . . . RCVRYk on the unselected word lines may be sequentially performed by group.

In exemplary embodiments of the inventive concept, groups of unselected word lines may be recovered in an ascending or descending order on the basis of a selected word line.

In exemplary embodiments of the inventive concept, groups of unselected word lines may be recovered in an ascending or descending order on the basis of a string selection line SSL.

With the immune disturbance read operation according to an exemplary embodiment of the inventive concept, boosting charges may be shared while recovery operations on groups of unselected word lines are sequentially performed. A recovery operation RCVYRk+1 on unselected wordlines corresponding to a channel on range and the selected word line may be executed after the charge sharing section Charge Sharing.

A recovery operation on string and ground selection lines SSL and GSL may be performed before and after a recovery operation is performed on word lines. Thus, negative boosting may be reduced in proportion to the amount of shared charges discharged to a bit line or a common source line CSL.

Figure 9:
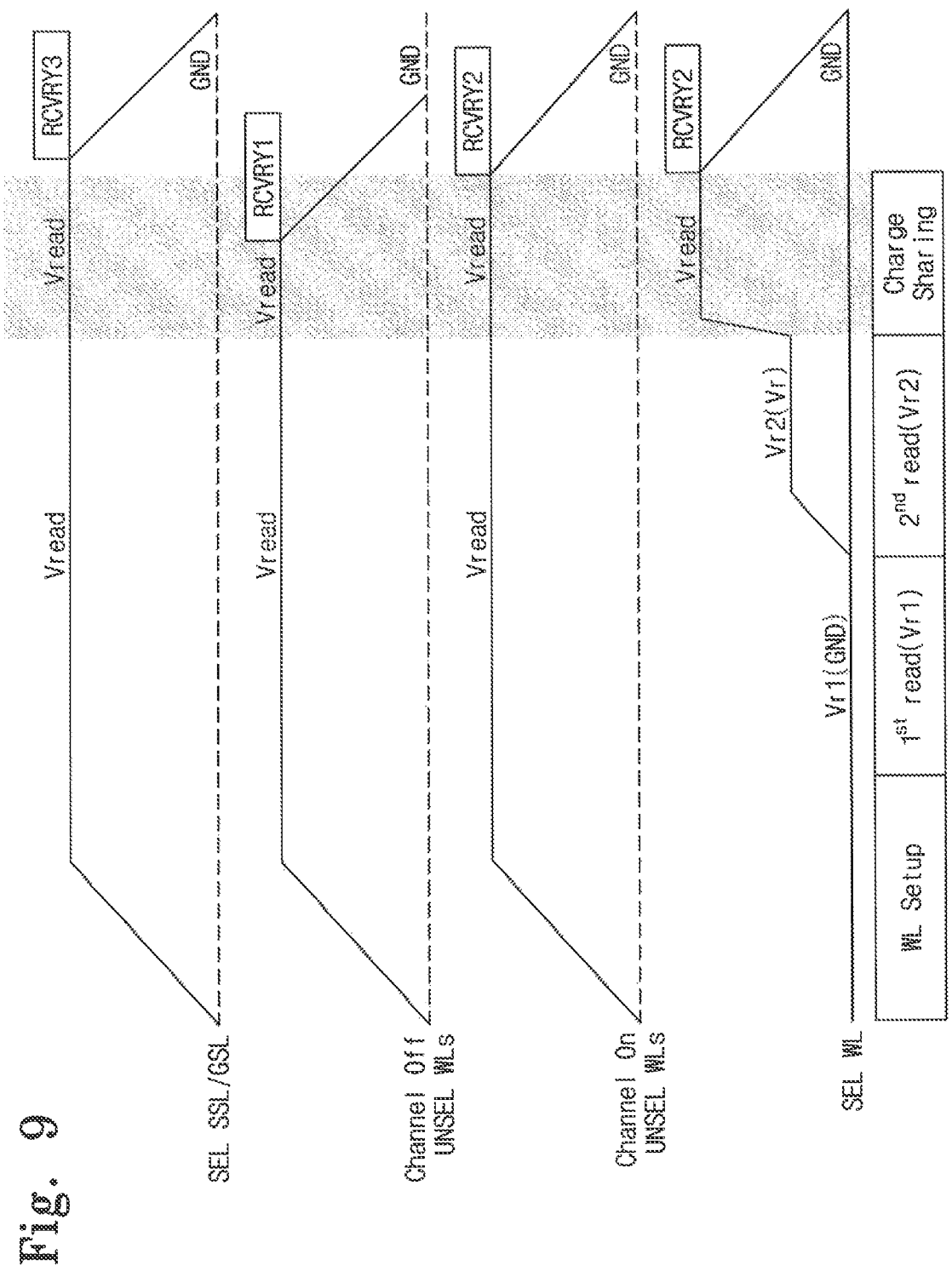
FIG. 9 is a timing diagram illustrating an immune disturbance read operation according to an exemplary embodiment of the inventive concept.

FIG. 9 is a timing diagram illustrating an immune disturbance read operation according to an exemplary embodiment of the inventive concept. Referring to FIG. 9, a recovery operation on all word lines may start, and charge sharing may be completed. Afterwards, a recovery operation RCVRY3 on string and ground selection lines SSL and GSL may be performed.

With the immune disturbance read operation according to an exemplary embodiment of the inventive concept, after a recovery operation on all word lines starts, a recovery operation on string and ground selection lines SSL and GSL may be performed.

In this case, a read disturbance generated at unselected strings (refer to FIG. 3, ST2 to ST4) may be reduced after a sensing operation.

Figure 10:
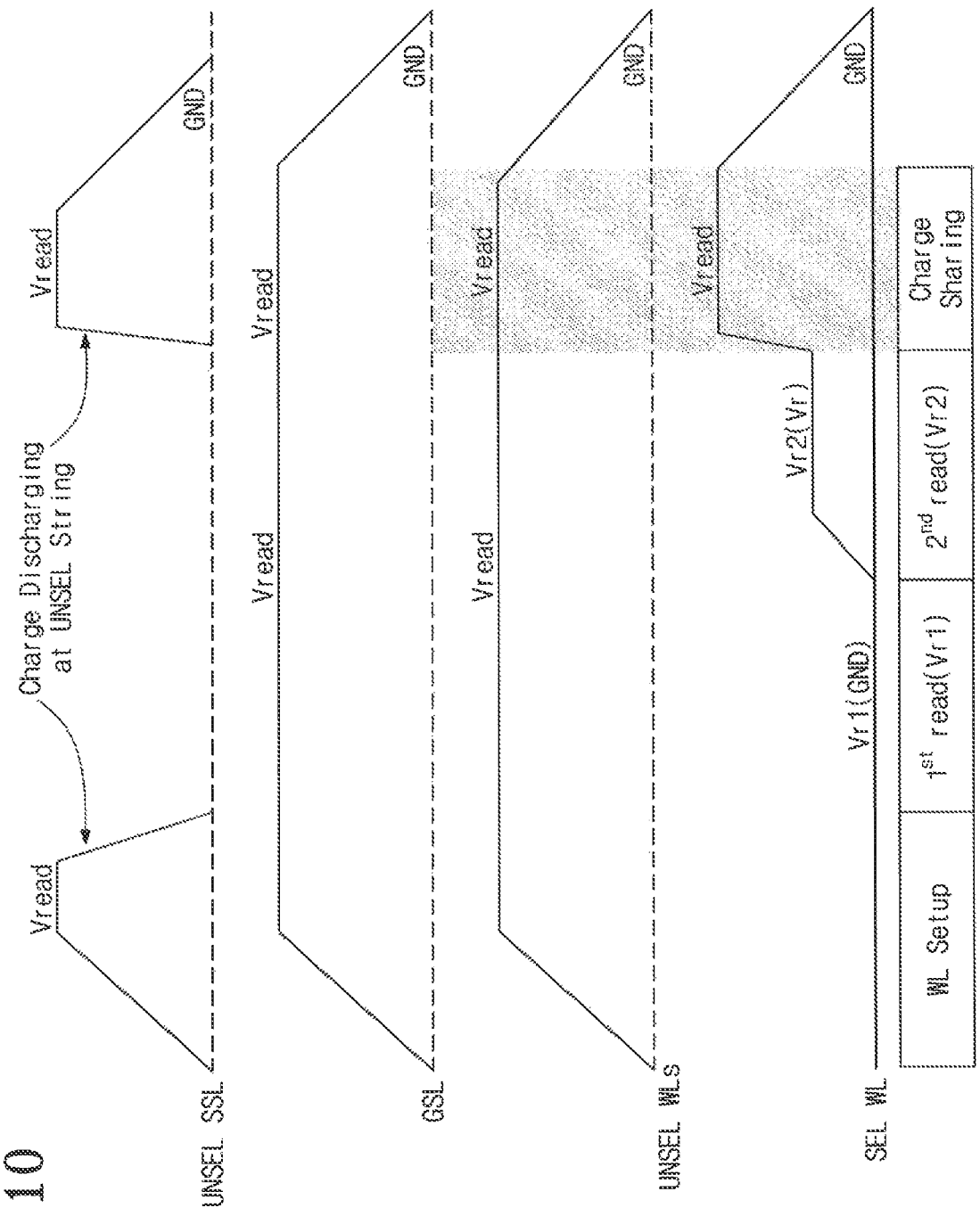
FIG. 10 is a timing diagram illustrating an immune disturbance read operation according to an exemplary embodiment of the inventive concept.

FIG. 10 is a timing diagram illustrating an immune disturbance read operation according to an exemplary embodiment of the inventive concept. Referring to FIG. 10, an immune disturbance read operation on unselected string selection lines UNSEL SSL may further include applying a read pass voltage Vread to unselected string selection lines UNSEL SSL in a charge sharing section Charge Sharing. In addition, as illustrated in FIG. 10, the read pass voltage Vread may be applied to unselected string selection lines UNSEL SSL before a sensing operation (e.g., before the $1^{st}$ read and $2^{nd}$ read). An operation of applying the read pass voltage Vread to unselected string selection lines UNSEL SSL at a sensing operation may be substantially the same as that described with reference to FIG. 3, and a description thereof is thus omitted.

With the immune disturbance read operation according to an exemplary embodiment of the inventive concept, a read disturbance generated after a sensing operation may be reduced by sharing or discharging boosting charges of channels of unselected strings ST2 to ST4.

In FIGS. 6 to 10, there are described exemplary embodiments of the inventive concept where charge sharing is performed after a sensing operation. However, the inventive concept is not limited thereto. Charge sharing according to an exemplary embodiment of the inventive concept can be performed before a sensing operation.

Figure 11:
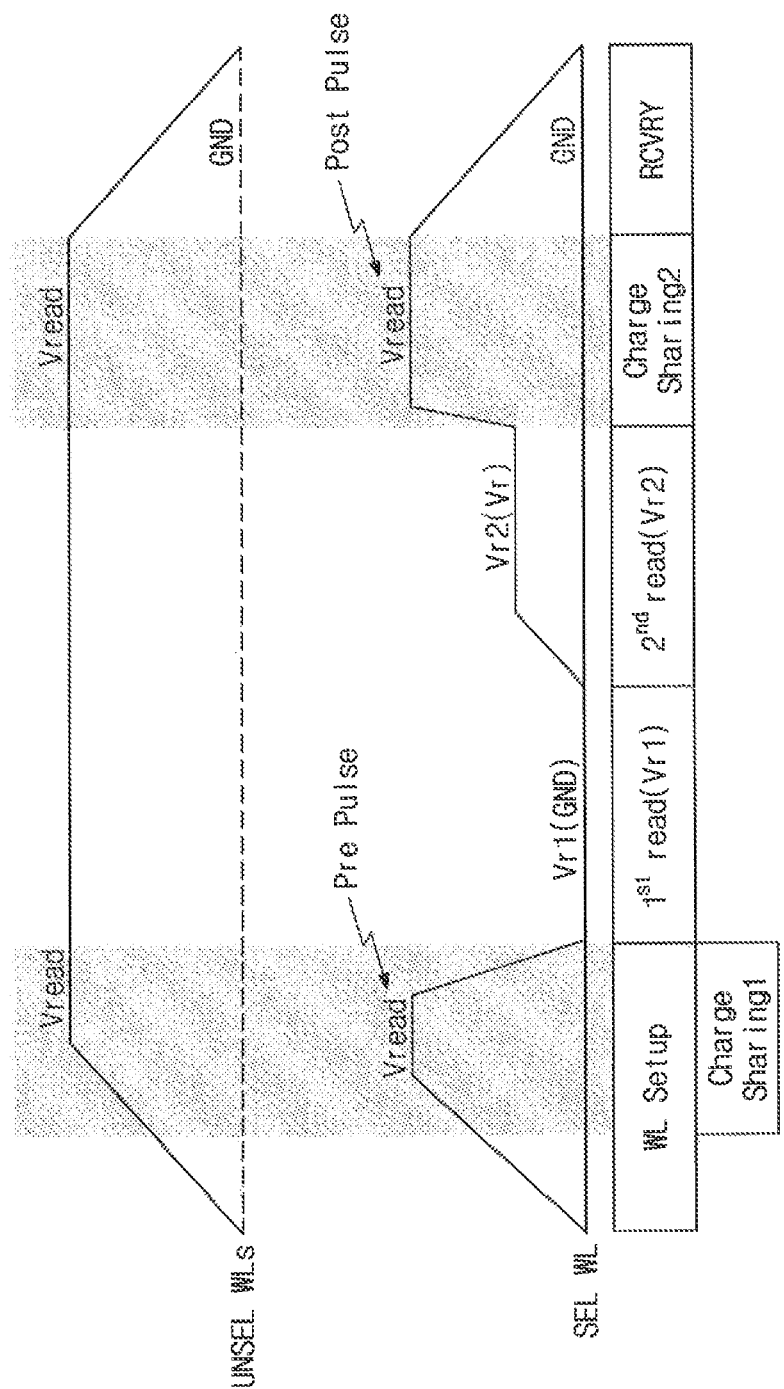
FIG. 11 is a timing diagram illustrating an immune disturbance read operation according to an exemplary embodiment of the inventive concept.

FIG. 11 is a timing diagram illustrating an immune disturbance read operation according to an exemplary embodiment of the inventive concept. Referring to FIG. 11, an immune disturbance read operation may apply a read pass voltage Vread to a selected word line SEL WL during a predetermined time before a sensing operation (e.g., before the $1^{st}$ read and $2^{nd}$ read). In other words, a word line setup section WL Setup may include a first charge sharing section Charge Sharing1. At this time, the read pass voltage Vread applied to the selected word line SEL WL during a predetermined time may be referred to as a pre-pulse. The read pass voltage Vread applied to the selected word line SEL WL in a second charge sharing section Charge Sharing2 after the sensing operation may be referred to as a post pulse.

With the immune disturbance read operation according to an exemplary embodiment of the inventive concept, a read disturbance may be reduced by sharing boosting charges before and after the sensing operation.

In FIGS. 6 to 11, there are described exemplary embodiments of the inventive concept where a read pass voltage Vread is applied to a selected word line at an immune disturbance read operation. However, the inventive concept is not limited thereto. For example, a turn-on voltage may be applied to a selected word line to turn on a string channel at an immune disturbance read operation.

Figure 12:
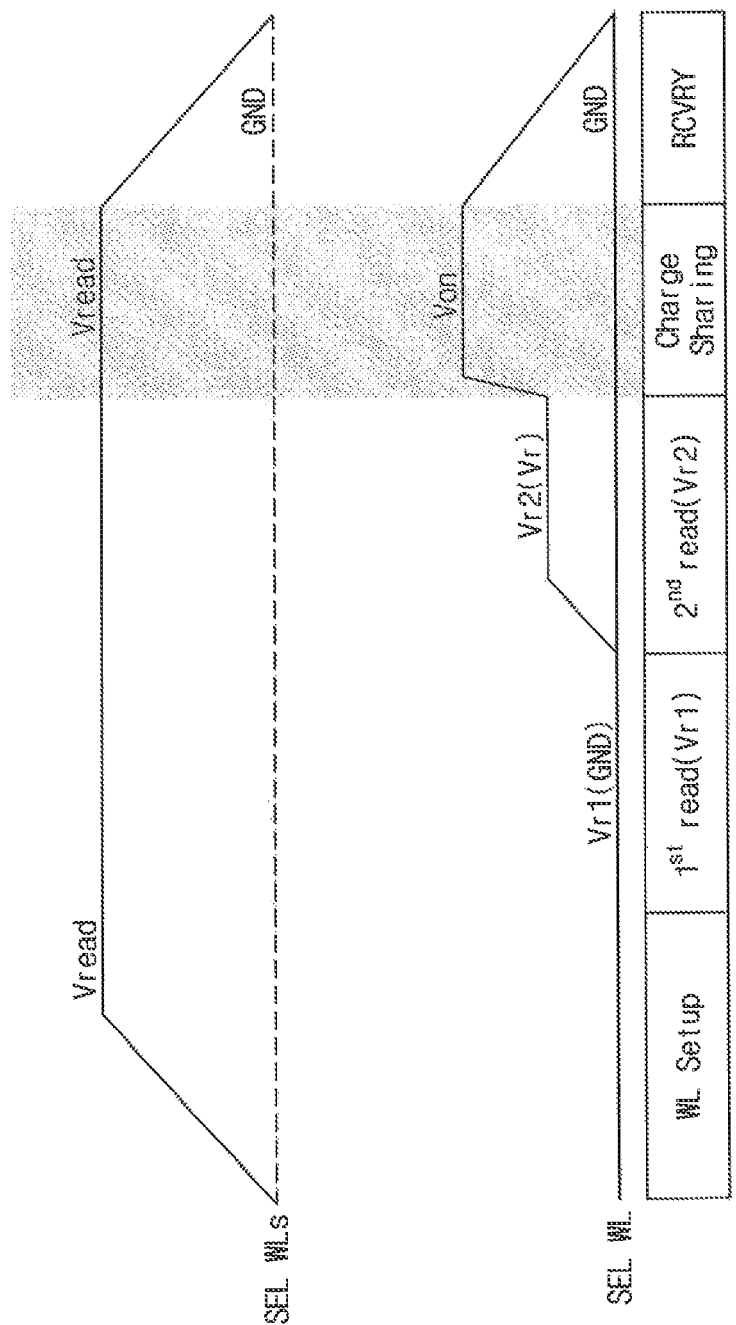
FIG. 12 is a timing diagram illustrating an immune disturbance read operation according to an exemplary embodiment of the inventive concept.

FIG. 12 is a timing diagram illustrating an immune disturbance read operation according to an exemplary embodiment of the inventive concept. Referring to FIG. 12, at an immune disturbance read operation, a turn-on voltage Von may be applied to a selected word line SEL WL in a charge sharing section Charge Sharing. The remaining bias conditions other than the turn-on voltage Von may be substantially the same as those described with reference to FIG. 6.

In FIGS. 1 to 12, there are described exemplary embodiments of the inventive concept where the same read pass voltage Vread is applied to unselected word lines at an immune disturbance read operation. However, the inventive concept is not limited thereto. An exemplary embodiment of the inventive concept may be implemented such that unselected word lines are grouped and different read pass voltages are applied to at least two unselected word line groups of the unselected word line groups. Below, a group of unselected word lines may be referred to as a zone.

Figure 13:
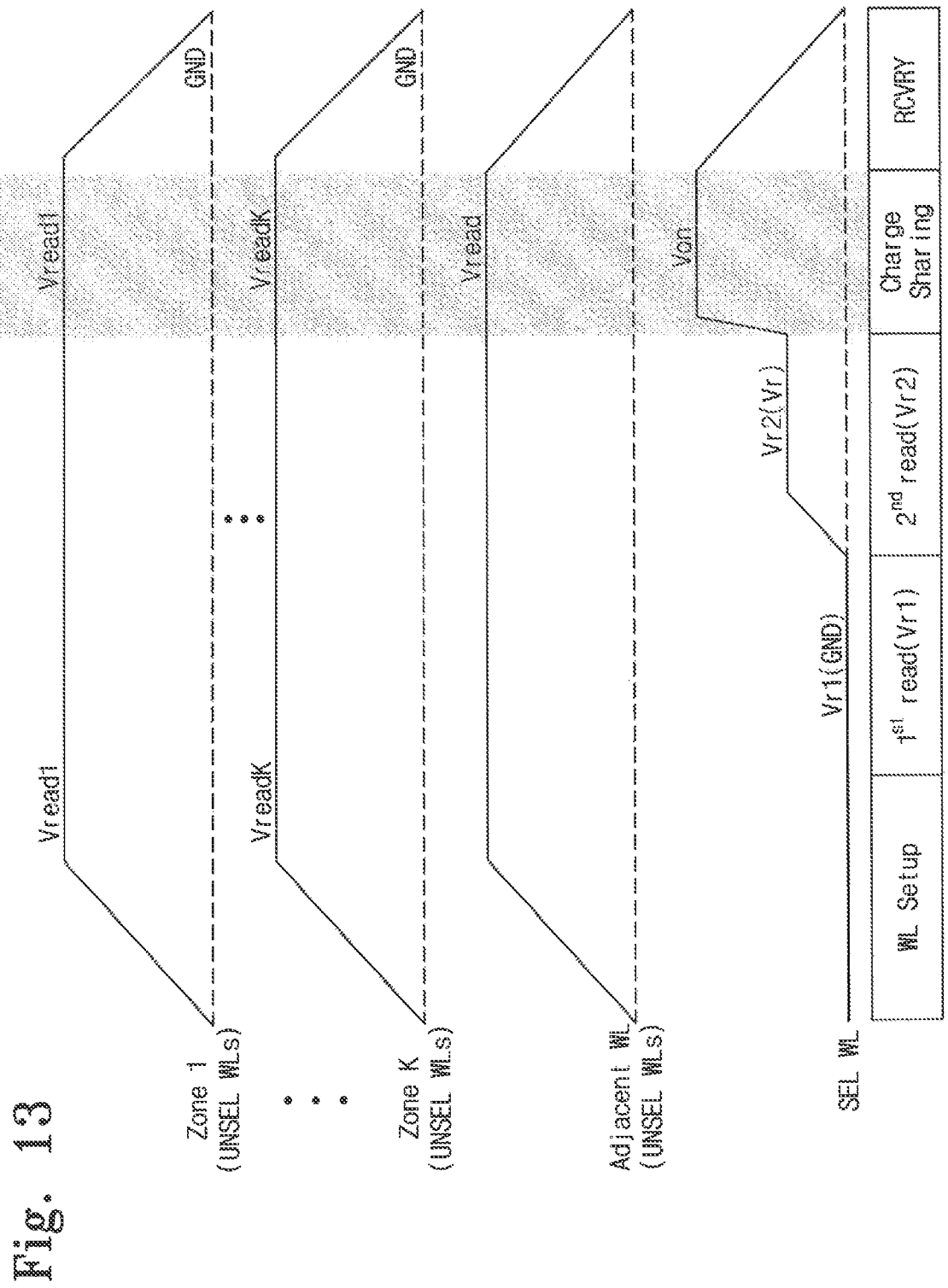
FIG. 13 is a timing diagram illustrating an immune disturbance read operation according to an exemplary embodiment of the inventive concept.

FIG. 13 is a timing diagram illustrating an immune disturbance read operation according to an exemplary embodiment of the inventive concept. Referring to FIG. 13, at an immune disturbance read operation, a turn-on voltage Von may be applied to a selected word line SEL WL in a charge sharing section Charge Sharing, a read pass voltage Vread may be applied to a word line adjacent to the selected word line Adjacent WL, and zone pass voltages (or, zone voltages) Vread1 to VreadK (K being an integer of 2 or more) may be applied to zones Zone1 to ZoneK. The word line adjacent to the selected word line Adjacent WL and the word lines of the zones Zone1 to ZoneK are unselected.

In exemplary embodiments of the inventive concept, the adjacent word line Adjacent WL may be an upper word line or a lower word line just adjacent to the selected word line SEL WL.

In exemplary embodiments of the inventive concept, a voltage of the adjacent word line Adjacent WL may be controlled regardless of zones.

In exemplary embodiments of the inventive concept, at least two of the zone pass voltages Vread1 to VreadK may be different from each other. For example, a zone pass voltage applied to memory cells adjacent to string selection transistors SST1 to SST4 on the basis of a selected word line may be lower than that applied to the remaining zones.

With the immune disturbance read operation according to an exemplary embodiment of the inventive concept, different read pass voltages may be applied to zones, respectively.

In addition, an immune disturbance read operation according to an exemplary embodiment of the inventive concept may be performed to sequentially discharge word lines in a direction from an uppermost word line (e.g., WLm in FIG. 3) to a lowermost word line (e.g., WL0 in FIG. 3). In addition, the immune disturbance read operation according to an exemplary embodiment of the inventive concept can be performed to sequentially discharge word lines in a direction from the lowermost word line WL0 to the uppermost word line WLm.

Figure 14:
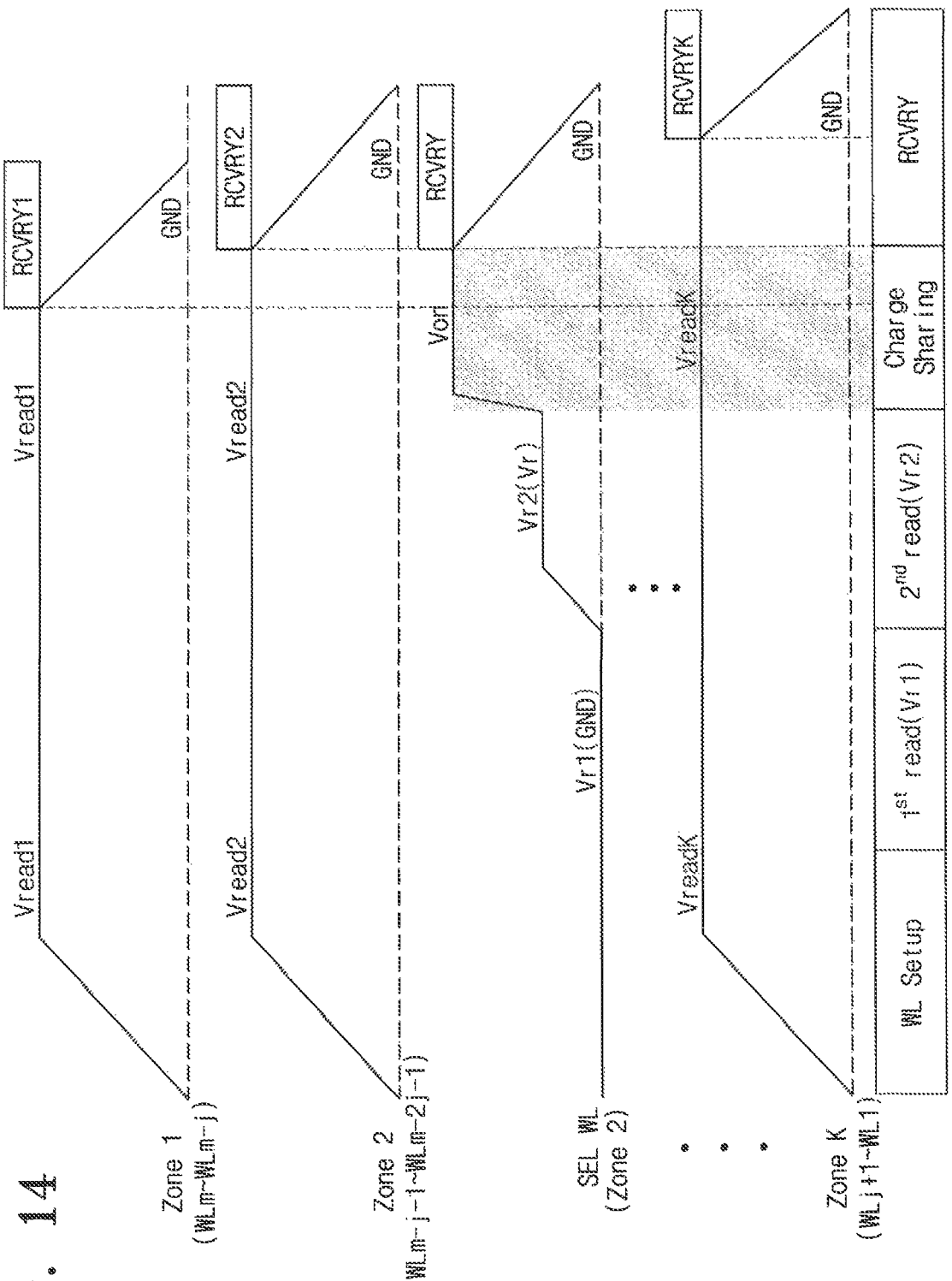
FIG. 14 is a timing diagram illustrating an immune disturbance read operation according to an exemplary embodiment of the inventive concept.

FIG. 14 is a timing diagram illustrating an immune disturbance read operation according to an exemplary embodiment of the inventive concept. Referring to FIG. 14, in a charge sharing range Charge Sharing of an immune disturbance read operation, a turn-on voltage Von may be applied to a selected word line SEL WL, zone pass voltages (or, zone voltages) Vread1 to VreadK (K being an integer of 2 or more) may be applied to zones Zone1 to ZoneK, and the zone pass voltages Vread1 to VreadK of the zones Zone1 to ZoneK may be sequentially discharged in recovery operations RCVRY1 to RCVRYK.

In exemplary embodiments of the inventive concept, each of the zones Zone1 to ZoneK may be formed of (j+1) word lines (j being an integer more than 0) starting from the uppermost word line WLm. However, the inventive concept is not limited thereto. For example, the number of word lines in one of at least two of the zones Zone1 to ZoneK can be different from that in the other of the at least two zones.

In exemplary embodiments of the inventive concept, as illustrated in FIG. 14, a zone pass voltage Vread1 of the first zone Zone1 closer to the uppermost word line WLm may be first discharged, and the remaining zone pass voltages Vread2 to VreadK may be sequentially discharged. Alternatively, a read pass voltage VreadK of the zone ZoneK closer to the lowermost word line WL1 may be first discharged.

In exemplary embodiments of the inventive concept, a turn-on voltage Von of a selected word line SEL WL may be discharged at the same time when a read pass voltage (e.g., Vread2) of a zone (e.g., Zone2) including the selected word line SEL WL is discharged.

With the immune disturbance read operation according to an exemplary embodiment of the inventive concept, read pass voltages Vread1 to VreadK of zones may be sequentially discharged.

Figure 15:
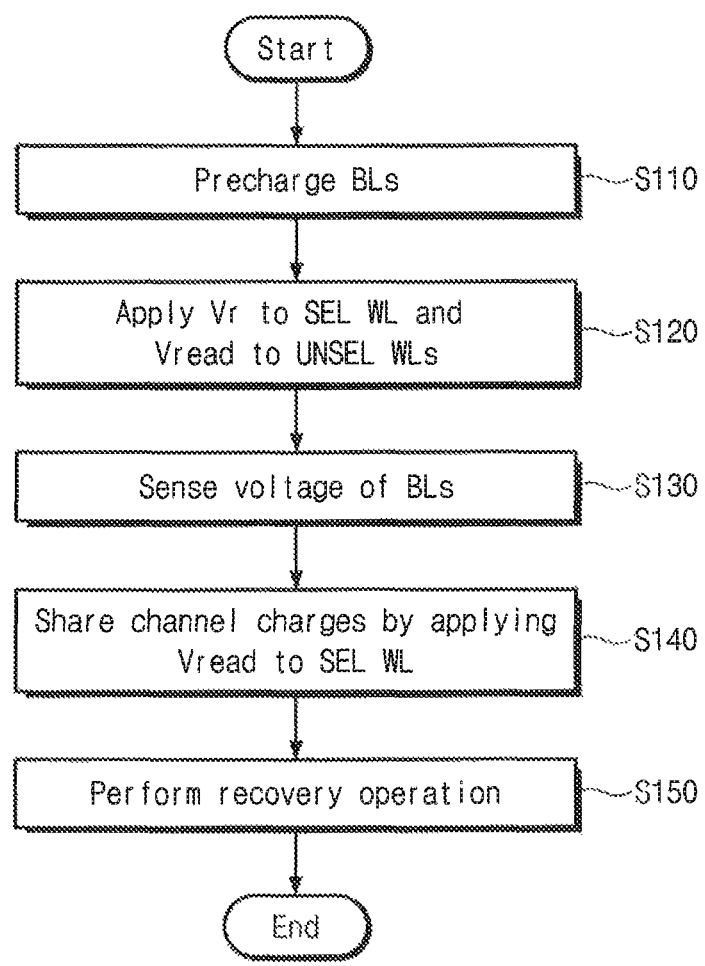
FIG. 15 is a flow chart illustrating a read method of a nonvolatile memory device according to an exemplary embodiment of the inventive concept.

FIG. 15 is a flow chart illustrating a read method of a nonvolatile memory device according to an exemplary embodiment of the inventive concept. Below, a read method of a nonvolatile memory device according to an exemplary embodiment of the inventive concept will be more fully described with reference to FIGS. 1 to 15.

In operation S110, all bit lines may be pre-charged for a read operation. In operation S120, a read voltage Vr may be applied to a selected word line and a read pass voltage Vread may be applied to unselected word lines. In operation S130, voltages of the bit lines may be sensed. In operation S140, channel charges may be shared by applying the read pass voltage Vread to the selected word line after the sensing operation. In operation S150, a recovery operation may be executed. Here, the recovery operation may be executed after channel charge sharing or during channel charge sharing.

With the read method according to an exemplary embodiment of the inventive concept, channel charges may be shared after a sensing operation.

Figure 16:
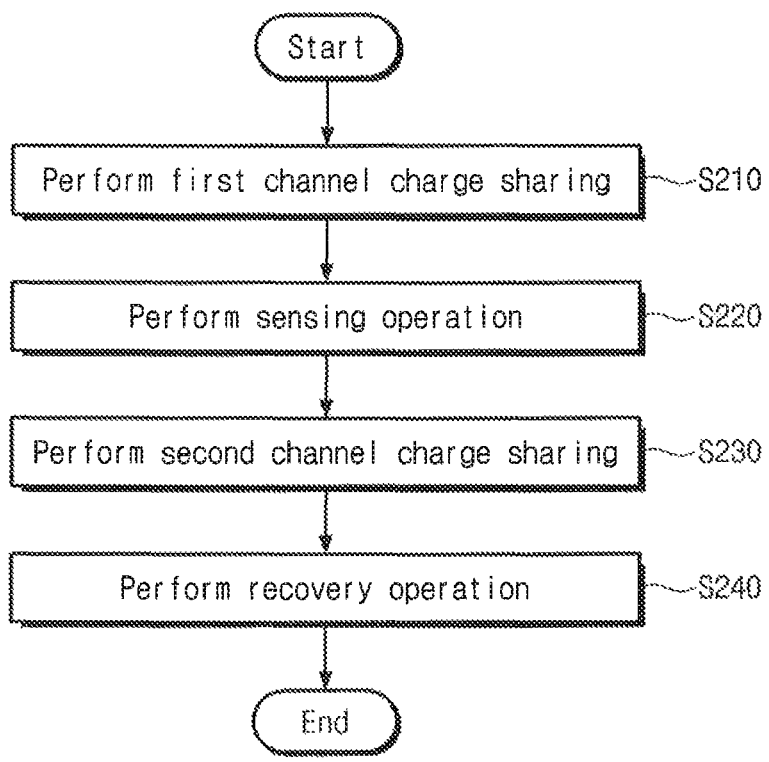
FIG. 16 is a flow chart illustrating a read method of a nonvolatile memory device according to an exemplary embodiment of the inventive concept.

FIG. 16 is a flow chart illustrating a read method of a nonvolatile memory device according to an exemplary embodiment of the inventive concept. Below, a read method of a nonvolatile memory device according to an exemplary embodiment of the inventive concept will be more fully described with reference to FIGS. 1 to 10 and 16.

In operation S210, a first channel charge sharing operation may be performed before a sensing operation. In operation S220, the sensing operation may be executed. In operation S230, a second channel charge sharing operation may be performed after the sensing operation. In operation S240, a recovery operation may be performed.

With the read method according to an exemplary embodiment of the inventive concept, channel charges may be shared before and after a sensing operation.

Figure 17:
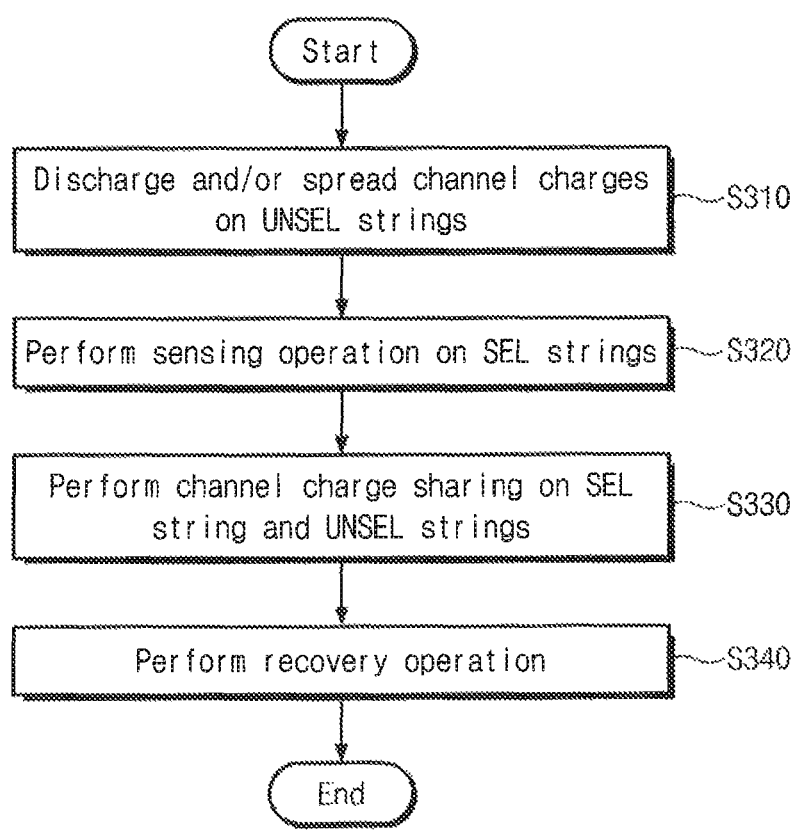
FIG. 17 is a flow chart illustrating a read method of a nonvolatile memory device according to an exemplary embodiment of the inventive concept.

FIG. 17 is a flow chart illustrating a read method of a nonvolatile memory device according to an exemplary embodiment of the inventive concept. Below, a read method of a nonvolatile memory device according to an exemplary embodiment of the inventive concept will be more fully described with reference to FIGS. 1 to 10 and 17.

In operation S310, channel charges of unselected strings ST2 to ST4 (refer to FIG. 3) may be spread or discharged. In operation S320, a sensing operation on a selected string ST1 (refer to FIG. 3) may be performed. In operation S330, a channel charge sharing operation on the selected and unselected strings ST1 to ST4 may be executed. In operation S340, a recovery operation may be performed.

With the read method according to an exemplary embodiment of the inventive concept, a channel charge sharing operation on the selected and unselected strings ST1 to ST4 may be executed.

In addition, a memory controller may determine whether an immune disturbance read mode of operation according to an exemplary embodiment of the inventive concept is required, and the immune disturbance read mode of operation according to an exemplary embodiment of the inventive concept may be executed according to the determination result.

Figure 18:
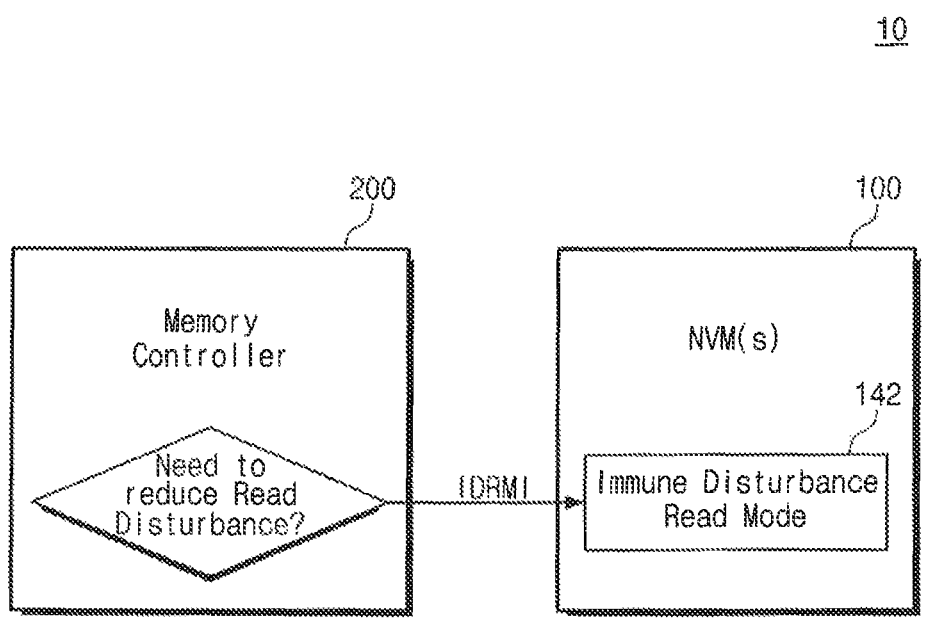
FIG. 18 is a block diagram illustrating a memory system according to an exemplary embodiment of the inventive concept.

FIG. 18 is a block diagram illustrating a memory system 10 according to an exemplary embodiment of the inventive concept. Referring to FIG. 18, the memory system 10 may include at least one nonvolatile memory device 100 and a memory controller 200 for controlling the at least one nonvolatile memory device 100.

The memory controller 200 may determine whether a decrease in a read disturbance is required, based on circumstance information or a user request. The memory controller 200 may send immune disturbance read mode information IDRMI to the nonvolatile memory device 100. The nonvolatile memory device 100 may include immune disturbance read mode 142 to perform an immune disturbance read operation in accordance with exemplary embodiments of the inventive concept described with reference to FIGS. 1 to 17 in response to the immune disturbance read mode information IDRMI.

In exemplary embodiments of the inventive concept, the immune disturbance read mode information IDRMI may be operating mode information. For example, in the case of a verification read operation of a program mode of operation, the immune disturbance read operation may not be performed. In the case of a read mode of operation, the immune disturbance read operation may be performed.

The memory system 10 according to an exemplary embodiment of the inventive concept may improve immunity to a read disturbance.

The immune disturbance read operation may be selectively performed at a program verification operation.

Figure 19:
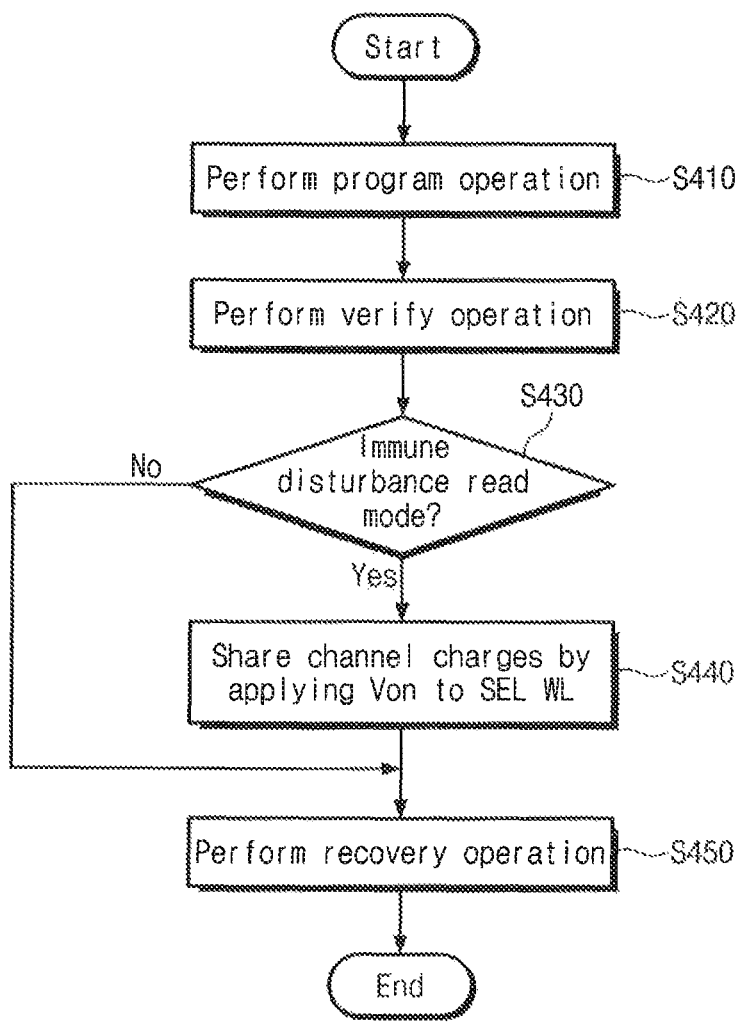
FIG. 19 is a flow chart illustrating a program method of a memory system according to an exemplary embodiment of the inventive concept.

FIG. 19 is a flow chart illustrating a program method of a memory system according to an exemplary embodiment of the inventive concept. Below, a program method of a memory system according to an exemplary embodiment of the inventive concept will be more fully described with reference to FIGS. 18 and 19.

In operation S410, memory cells connected with a selected word line may be programmed. In operation S420, a verification read operation on the memory cells connected with the selected word line may be performed. In operation S430, whether a mode of operation is an immune disturbance read mode may be determined based on immune disturbance read mode information IDRMI provided from the memory controller 200. If the mode of operation is an immune disturbance read mode, a turn-on voltage may be applied to the selected word line for channel charge sharing. In operation S450, a recovery operation may be performed. If the mode of operation is not the immune disturbance read mode, the method may proceed to operation S450.

With the program method according to an exemplary embodiment of the memory system of the inventive concept, an immune disturbance read mode may be decided at a verification read operation.

A read method of the memory system according to an exemplary embodiment of the inventive concept may perform an immune disturbance read operation according to a level of deterioration of memory cells. Here, the level of deterioration may be provided using program/erase (P/E) cycling, the number of errors detected by error checking and correction (ECC), wear-leveling level, etc.

Figure 20:
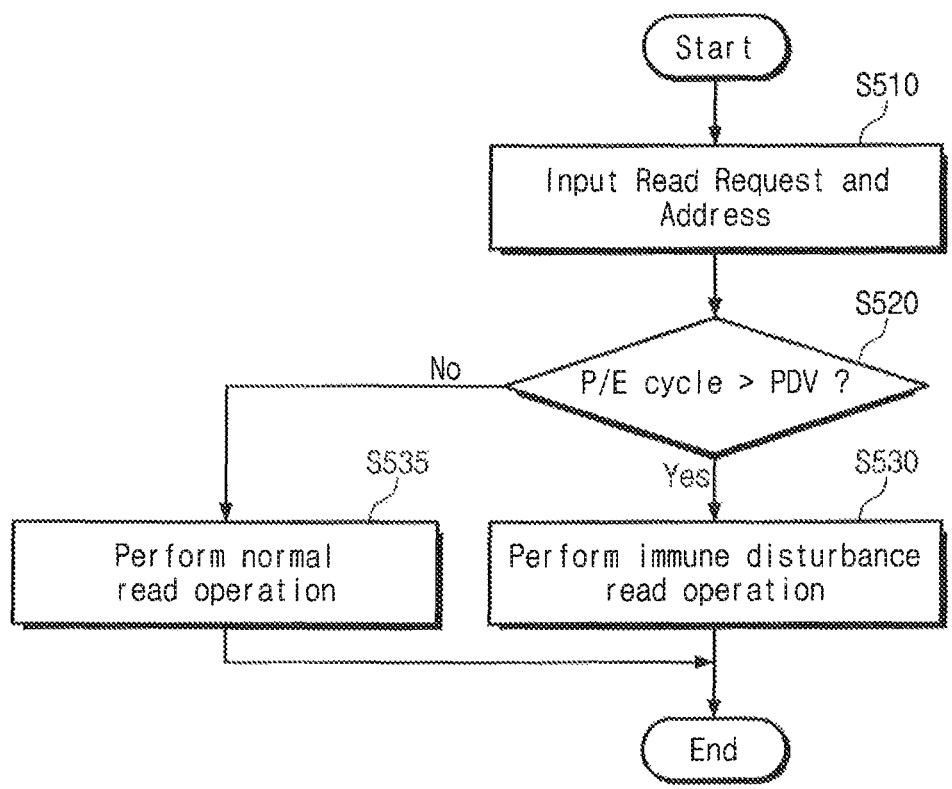
FIG. 20 is a read method of a memory system according to an exemplary embodiment of the inventive concept.

FIG. 20 is a read method of a memory system according to an exemplary embodiment of the inventive concept. Below, a read method of a memory system according to an exemplary embodiment of the inventive concept will be more fully described with reference to FIGS. 18 and 20.

In operation S510, the memory system 10 may receive a read request and an address from an external device. In operation S520, the memory controller 200 may determine whether a P/E cycle value of a memory block corresponding to the input address is larger than a predetermined value PDV.

If the P/E cycle value is larger than the predetermined value PDV, in operation S530, an immune disturbance read operation may be performed. On the other hand, if the P/E cycle value is smaller than the predetermined value PDV, in operation S535, a normal read operation may be performed.

With the read method of the memory system 10 according to an exemplary embodiment of the inventive concept, whether to perform an immune disturbance read operation may be decided according to a P/E cycle value of a read requested memory block.

In FIGS. 1 to 20, there are described exemplary embodiments of the inventive concept applied to a vertical NAND flash memory. However, the inventive concept is not limited thereto. The inventive concept is applicable to a nonvolatile memory device that has a memory cell with a Silicon On Insulator (SOI) body (also referred to as a floating body cell) causing negative boosting at a recovery operation. In particular, an exemplary embodiment of the inventive concept is applicable to a shared bit line structure having strings formed on an SOI substrate.

Figure 21:
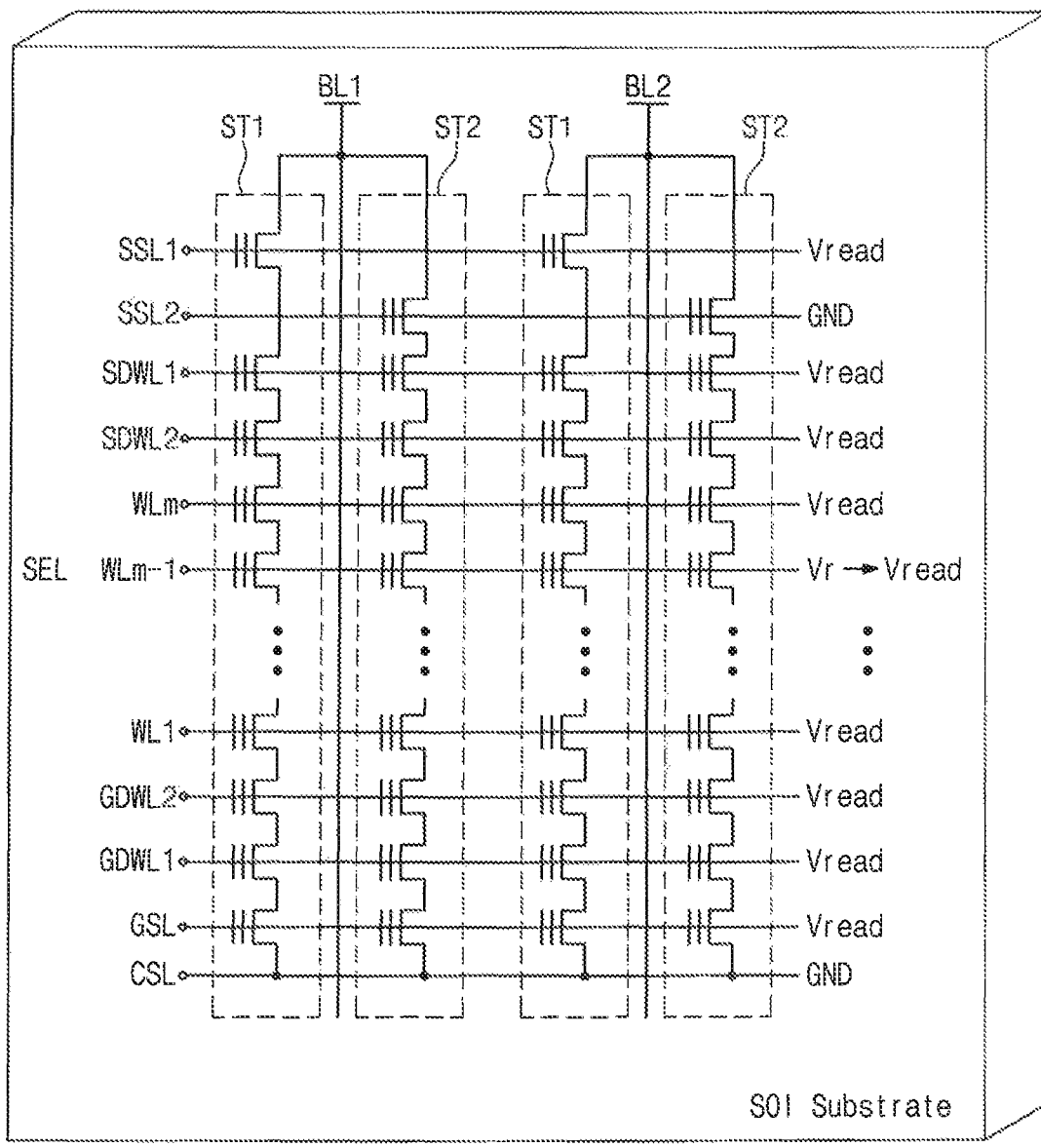
FIG. 21 is a diagram illustrating a shared bit line structure having strings formed on a Silicon On Insulator (SOI) substrate, according to an exemplary embodiment of the inventive concept.

FIG. 21 is a diagram illustrating a shared bit line structure having strings formed on an SOI substrate, according to an exemplary embodiment of the inventive concept. Referring to FIG. 21, two strings ST1 and ST2 may be connected with a bit line BL1/BL2. One of the first and second strings ST1 and ST2 may be selected according to a voltage applied to one of string selection lines SSL1 and SSL2. A string selection transistor for selecting one of the strings ST1 and ST2 may be formed of a combination of a depletion type transistor and an enhancement type transistor.

As illustrated in FIG. 21, at an immune disturbance read operation associated with the first strings ST1, a read pass voltage Vread may be applied to the first string selection line SSL1, unselected word lines WL1 to WLm−2 and WLm, and dummy word lines SDWL1, SDWL2, GDWL1, and GDWL2, the second string selection line SSL2 may be grounded, and a read voltage Vr may be applied to a selected word line WLm−1. The read pass voltage Vread may further be applied to a ground select line GSL and a common source line CSL may be grounded. Under this bias condition, a sensing operation may be performed. After the sensing operation is performed, the read pass voltage Vread may be applied to the selected word line WLm−1 for channel charge sharing.

In FIG. 21, there is illustrated an exemplary embodiment of the inventive concept where two strings are connected to a bit line. However, the inventive concept is not limited thereto. The immune disturbance read operation according to an exemplary embodiment of the inventive concept is applicable to a structure in which at least two or more strings are connected to a bit line.

The inventive concept is applicable to a solid state drive (SSD).

Figure 22:
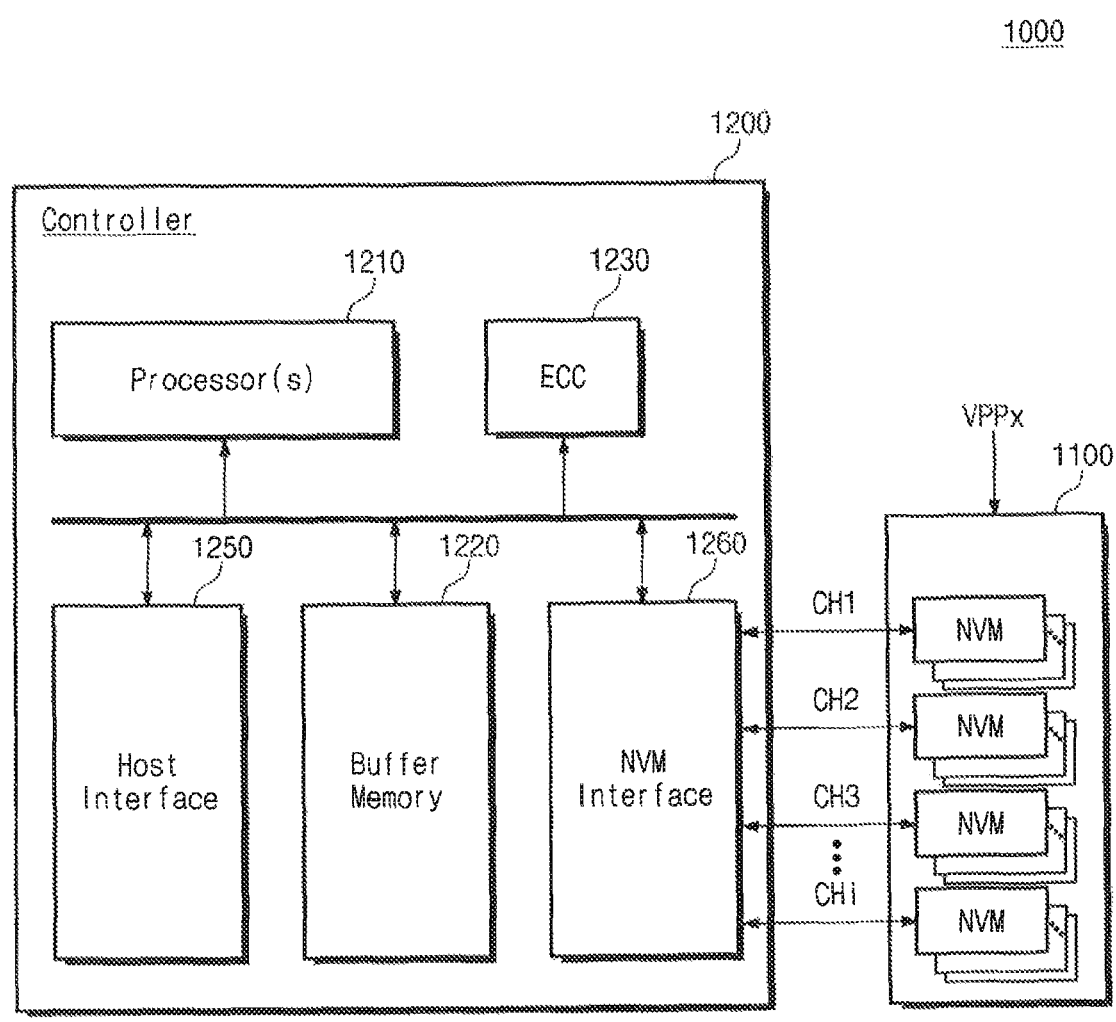
FIG. 22 is a block diagram illustrating a solid state drive according to an exemplary embodiment of the inventive concept.

FIG. 22 is a block diagram illustrating an SSD 1000 according to an exemplary embodiment of the inventive concept. Referring to FIG. 22, the SSD 1000 may include a plurality of nonvolatile memory devices 1100 and an SSD controller 1200.

The nonvolatile memory devices 1100 may be supplied with an external high voltage VPPx. Each of the nonvolatile memory devices 1100 may be implemented to perform an immune disturbance read mode operation in accordance with exemplary embodiments of the inventive concept described with reference to FIGS. 1 to 20.

The SSD controller 1200 may be connected to the nonvolatile memory devices 1100 through a plurality of channels CH1 to CHi (i being an integer of 2 or more). The SSD controller 1200 may include at least one processor 1210, a buffer memory 1220, an ECC circuit 1230, a host interface 1250, and a nonvolatile memory interface 1260.

The buffer memory 1220 may be configured to temporarily store data needed to drive the SSD controller 1200. In exemplary embodiments of the inventive concept, the buffer memory 1220 may store an error rate table ERT according to an operating condition. The buffer memory 1220 may include a plurality of memory lines for storing data or commands. Here, the plurality of memory lines may be mapped on cache lines in various methods.

The ECC circuit 1230 may calculate an ECC value of data to be programmed at a write operation. The ECC circuit 1230 may correct an error of data read at a read operation based on an ECC value. The ECC circuit 1230 may correct an error of data restored by the nonvolatile memory device 1100 at a data restoring operation. A code memory may be further provided which stores code data needed to drive the SSD controller 1200. The code memory may be formed of a nonvolatile memory device.

The host interface 1250 may interface with an external device. The nonvolatile memory interface 1260 may interface with the nonvolatile memory devices 1100.

The SSD 1000 according to an exemplary embodiment of the inventive concept may perform an immune disturbance read mode operation for improved performance.

The inventive concept is applicable to an embedded multi media card (eMMC), a moviNAND, an iNAND, etc.

Figure 23:
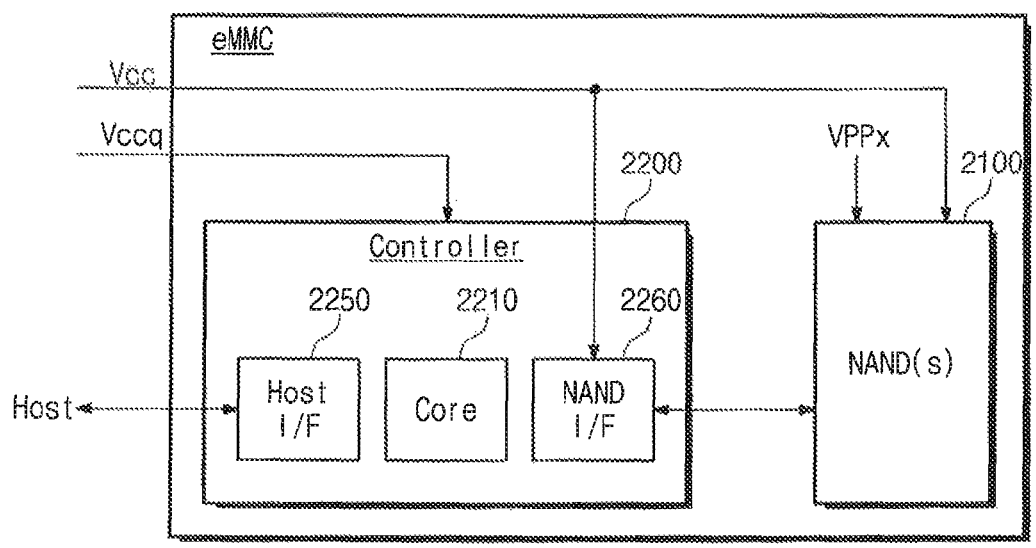
FIG. 23 is a block diagram illustrating an embedded Multi Media Card (eMMC) according to an exemplary embodiment of the inventive concept.

FIG. 23 is a block diagram illustrating an eMMC 2000 according to an exemplary embodiment of the inventive concept. Referring to FIG. 23, the eMMC 2000 may include at least one NAND flash memory device 2100 and a controller 2200.

The NAND flash memory device 2100 may be a single data rate (SDR) NAND flash memory device. The NAND flash memory device 2100 may be a vertical NAND flash memory (VNAND) which is implemented to perform an immune disturbance read mode operation according to an exemplary embodiment of the inventive concept. The controller 2200 may be connected to the NAND flash memory device 2100 through a plurality of channels. The controller 2200 may include at least one controller core 2210, a host interface 2250, and a NAND interface 2260. The at least one controller core 2210 may control an overall operation of the eMMC 2000. The host interface 2250 may provide an interface between a host and the controller 2200. The NAND interface 2260 may provide an interface between the controller 2200 and the NAND flash memory device 2100. In exemplary embodiments of the inventive concept, the host interface 2250 may be a parallel interface (e.g., an MMC interface). In exemplary embodiments of the inventive concept, the host interface 2250 may be a serial interface (e.g., ultra high speed (UHS)-II, universal flash storage (UFS), etc.).

The eMMC 2000 may receive power supply voltages Vcc and Vccq from the host. Herein, the power supply voltage Vcc (e.g., about 3.3V) may be supplied to the NAND flash memory device 2100 and the NAND interface 2260, and the power supply voltage Vccq (e.g., about 1.8V/3.3V) may be supplied to the controller 2200. In exemplary embodiments of the inventive concept, the eMMC 2000 may be optionally supplied with an external high voltage.

The eMMC 2000 according to an exemplary embodiment of the inventive concept may be implemented to control channel charges of a string before/after a sensing operation to improve the reliability of data.

The inventive concept is applicable to UFS.

Figure 24:
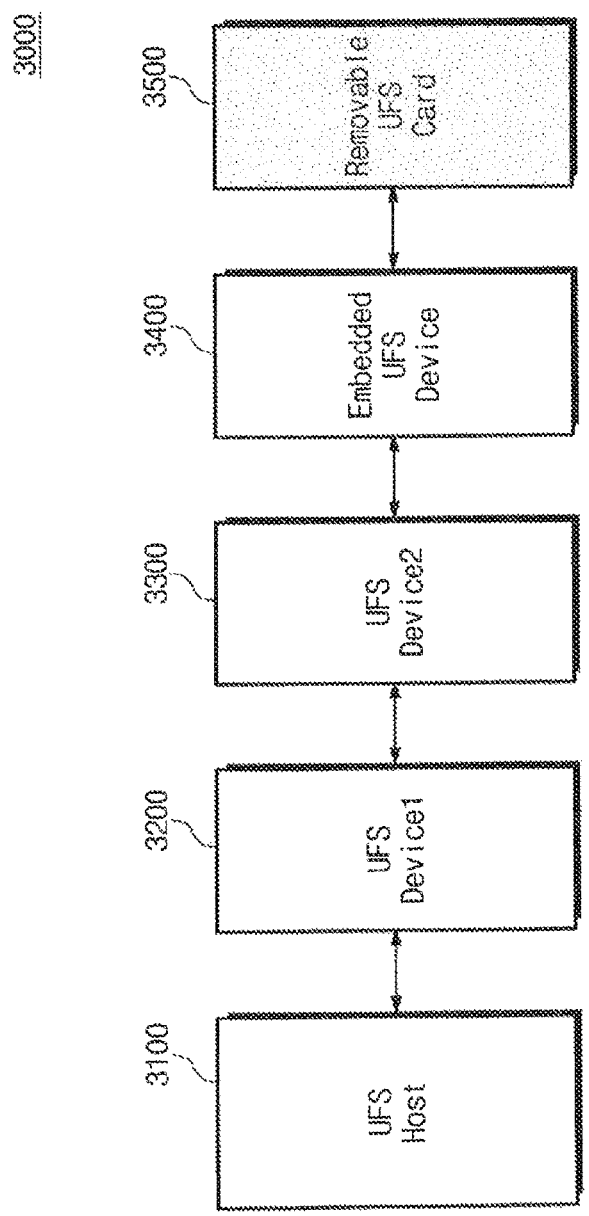
FIG. 24 is a block diagram illustrating a Universal Flash Storage (UFS) system according to an exemplary embodiment of the inventive concept.

FIG. 24 is a block diagram illustrating a UFS system 3000 according to an exemplary embodiment of the inventive concept. Referring to FIG. 24, the UFS system 3000 may include a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may include the memory system 10 illustrated in FIG. 18 which performs an immune disturbance read mode operation according to an exemplary embodiment of the inventive concept.

In addition, the embedded UFS device 3400 and the removable UFS card 3500 may perform communications using protocols different from the UFS protocol. The UFS host 3100 and the removable UFS card 3500 may communicate through various card protocols (e.g., universal serial bus flash drive, MMC, secure digital (SD), mini SD, Micro SD, etc.).

The inventive concept is applicable to a mobile device.

Figure 25:
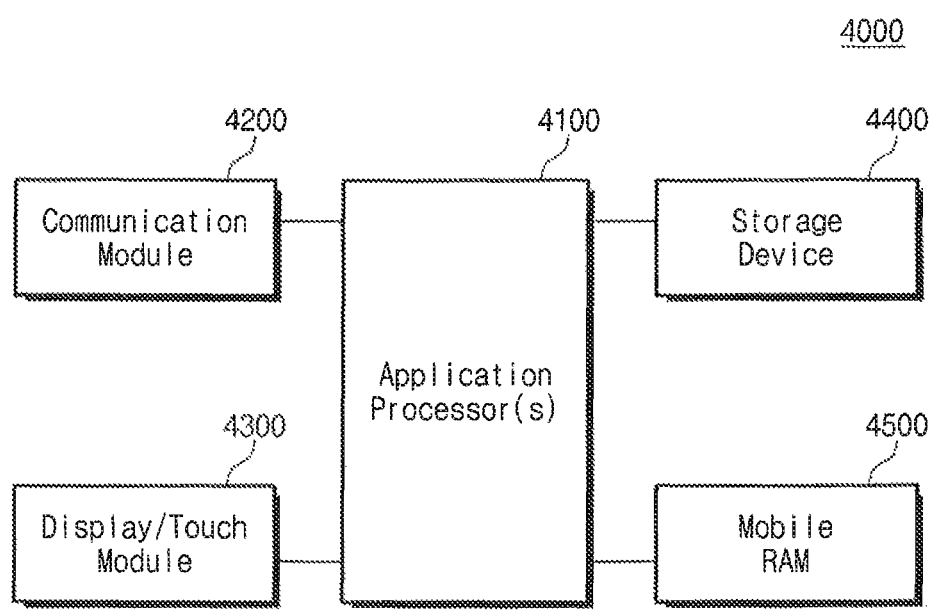
FIG. 25 is a block diagram illustrating a mobile device according to an exemplary embodiment of the inventive concept.

FIG. 25 is a block diagram illustrating a mobile device 4000 according to an exemplary embodiment of the inventive concept. Referring to FIG. 25, the mobile device 4000 may include an application processor 4100, a communication module 4200, a display/touch module 4300, a storage device 4400, and a mobile random access memory (RAM) 4500.

The application processor 4100 may control an overall operation of the mobile device 4000. The communication module 4200 may be implemented to control wireless/wire communications with an external device. The display/touch module 4300 may display data processed by the application processor 4100 and receive data through a touch panel. The storage device 4400 may be implemented to store user data. The storage device 4400 may be eMMC, SSD, UFS device or the like. The storage device 4400 may include a nonvolatile memory device which performs an immune disturbance read mode operation in accordance with exemplary embodiments of the inventive concept described with reference to FIGS. 1 to 20. The mobile DRAM 4500 may be configured to temporarily store data needed for a process operation of the mobile device 4000.

The mobile device 4000 according to an exemplary embodiment of the inventive concept may improve its performance by performing a read operation having immunity to disturbance.

A memory system or a storage device according to an exemplary embodiment of the inventive concept may be packed using various types of packages. For example, a nonvolatile memory device or a memory controller according to an exemplary embodiment of the inventive concept may be packed using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been particularly shown and described with reference to exemplary embodiments thereof, it will be apparent to those of ordinary skill in the art that various changes in form and detail may be made thereto without departing from the spirit and scope of the present inventive concept as defined by the claims.

What is claimed is:

1. A method of reading a nonvolatile memory device which includes at least one string connected to a bit line, the at least one string including a plurality of memory cells connected in series, each of the plurality of memory cells being connected to respective word line of a plurality of word lines and stacked in a direction perpendicular to a substrate, comprising:
applying a read voltage to a selected wordline of the nonvolatile memory device;
applying a read pass voltage to unselected wordlines of the nonvolatile memory device;
sensing a state of a memory cell connected to the selected wordline;
applying the read pass voltage to the selected wordline after the sensing; and
discharging the read pass voltage of at least one of the unselected wordlines while the read pass voltage is applied to the selected wordline.

2. The method of claim 1, further comprising discharging the read pass voltages of the selected wordline and the unselected wordlines.

3. The method of claim 1, wherein the read voltage includes a first voltage and a second voltage, and the second voltage has a level between the first voltage and the read pass voltage.

4. The method of claim 1, wherein a voltage of the unselected wordlines disposed between the selected wordline and a string selection line of the nonvolatile memory device begins to be discharged while the read pass voltage is applied to the selected wordline.

5. The method of claim 4, wherein a voltage of the unselected wordlines disposed between the selected wordline and a ground selection line of the nonvolatile memory device begins to be discharged after the read pass voltage is applied to the selected wordline.

6. The method of claim 1, wherein the unselected wordlines disposed between the selected wordline and a string selection line of the nonvolatile memory device include a first wordline group and a second wordline group, and a voltage of the first wordline group and a voltage of the second wordline group are sequentially discharged.

7. The method of claim 6, wherein the voltage of the first wordline group and the voltage of the second wordline group are different from each other.

8. The method of claim 1, further comprising discharging voltages of a selected string selection line or a selected ground selection line of the nonvolatile memory device.

9. The method of claim 1, further comprising:
applying the read pass voltage to an unselected string selection line of the nonvolatile memory device after the sensing; and
discharging the read pass voltage of the unselected string selection line.

10. The method of claim 1, further comprising:
applying the read pass voltage to an unselected string selection line of the nonvolatile memory device before the sensing; and
discharging the read pass voltage of the unselected string selection line.

11. The method of claim 1, further comprising:
applying the read pass voltage to the selected wordline before the sensing; and
discharging the read pass voltage of the selected wordline before the sensing.

12. A method of reading a nonvolatile memory device which includes at least one string connected to a bit line, the at least one string including a plurality of memory cells connected in series, each of the plurality of memory cells being connected to a respective word line of a plurality of word lines and stacked in a direction perpendicular to a substrate, comprising:
applying a read voltage to a selected wordline of the nonvolatile memory device;
applying a read pass voltage to unselected wordlines of the nonvolatile memory device;
sensing a state of a memory cell connected to the selected wordline;
applying a turn-on voltage to the selected wordline after the sensing; and
discharging the read pass voltage of at least one of the unselected wordlines while the turn-on voltage is applied to the selected wordline.

13. The method of claim 12, wherein a plurality of different read pass voltages are applied the unselected wordlines.

14. The method of claim 13, further comprising discharging the voltages of the unselected wordlines and the selected wordline, wherein the voltages of the unselected wordlines are sequentially discharged.

15. The method of claim 12, wherein the turn-on voltage is higher than the read voltage and lower than the read pass voltage.

16. A method of reading a nonvolatile memory device which includes at least one string connected to a bit line, the at least one string including a plurality of memory cells connected in series, each of the plurality of memory cells being connected to a respective word line of a plurality of word lines and stacked in a direction perpendicular to a substrate, comprising:
applying a read voltage to a selected wordline of the nonvolatile memory device;
applying a read pass voltage to unselected wordlines of the nonvolatile memory device;
sensing a state of a memory cell connected to the selected wordline; and
applying a turn-on voltage to the selected wordline after the sensing and while the read pass voltage is applied to the unselected wordlines,
wherein a voltage of the unselected wordlines disposed between the selected wordline and a string selection line of the nonvolatile memory device is discharging while the turn-on voltage is applied to the selected wordline.

17. The method of claim 16, wherein the turn-on voltage is applied to the selected wordline according to health information of the nonvolatile memory device.

18. The method of claim 17, wherein the health information includes a level of deterioration of memory cells, program/erase cycling information, wear-leveling information, or a number of errors detected by error checking and correction.

19. The method of claim 16, wherein the turn-on voltage is applied to the selected wordline when a program/erase cycle value of a read requested memory block is larger than a predetermined value.

20. The method of claim 16, wherein the unselected wordlines are arranged in a plurality of zones and voltages of the zones are sequentially discharged from a zone near the string selection line to a zone near a ground selection line of the nonvolatile memory device.

21. A memory system, comprising:
a memory controller configured to output immune disturbance read mode information; and
a nonvolatile memory device which includes at least one string connected to a bit line, the at least one string including a plurality of memory cells connected in series, each of the plurality of memory cells being connected to a respective word line of a plurality of word lines and stacked in a direction perpendicular to a substrate,
wherein the nonvolatile memory device programs memory cells connected to a selected wordline, performs a verification read operation on the memory cells connected to the selected wordline and, in response to the immune disturbance read mode information, applies a turn-on voltage to the selected wordline while a read pass voltage is applied to unselected wordlines and discharges the read pass voltage of at least one of the unselected wordlines while the turn-on voltage is applied to the selected wordline.

22. The system of claim 21, wherein the memory controller generates the immune disturbance read mode information when a program/erase cycle value of a read requested memory block is larger than a predetermined value.

23. The system of claim 21, wherein the wordlines are stacked on top of each other between a substrate and a bit line.

24. The system of claim 21, wherein the nonvolatile memory device includes first and second adjacent strings connected with a first bit line, wherein the first and second strings each include string selection lines, wordlines, and dummy wordlines.

25. The system of claim 24, wherein the first and second strings are disposed on a silicon on insulator substrate.

* * * * *